United States Patent
Aoyama et al.

(10) Patent No.: US 10,580,667 B2
(45) Date of Patent: Mar. 3, 2020

(54) LIGHT-IRRADIATION HEAT TREATMENT METHOD AND HEAT TREATMENT APPARATUS

(71) Applicant: SCREEN HOLDINGS CO., LTD., Kyoto (JP)

(72) Inventors: Takayuki Aoyama, Kyoto (JP); Yasuaki Kondo, Kyoto (JP); Shinji Miyawaki, Kyoto (JP); Shinichi Kato, Kyoto (JP); Kazuhiko Fuse, Kyoto (JP); Hideaki Tanimura, Kyoto (JP); Akitsugu Ueda, Kyoto (JP); Hikaru Kawarazaki, Kyoto (JP); Masashi Furukawa, Kyoyo (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 396 days.

(21) Appl. No.: 15/638,068

(22) Filed: Jun. 29, 2017

(65) Prior Publication Data

US 2018/0005848 A1 Jan. 4, 2018

(30) Foreign Application Priority Data

Jun. 30, 2016 (JP) .................... 2016-130051

(51) Int. Cl.
*H01L 21/67* (2006.01)
*H01L 21/762* (2006.01)
(Continued)

(52) U.S. Cl.
CPC ........ *H01L 21/67* (2013.01); *H01L 21/67109* (2013.01); *H01L 21/67115* (2013.01);
(Continued)

(58) Field of Classification Search
CPC combination set(s) only.
See application file for complete search history.

(56) References Cited

U.S. PATENT DOCUMENTS 9,023,688 B1 * 5/2015 Or-Bach ............. H01L 23/3677
257/E21.532
2008/0000551 A1 1/2008 Sato et al.
(Continued)

FOREIGN PATENT DOCUMENTS

JP 2000-243719 A 9/2000
JP 2001-004282 A 1/2001
(Continued)

OTHER PUBLICATIONS

Taiwanese Office Action issued in corresponding Taiwanese Patent Application No. 106117496, dated Jul. 12, 2018, with partial English Translation.
(Continued)

*Primary Examiner* — David P Porta
*Assistant Examiner* — Fani Boosalis
(74) *Attorney, Agent, or Firm* — McDermott Will & Emery LLP

(57) ABSTRACT

A heat treatment apparatus is provided with two cool chambers, that is, a first cool chamber and a second cool chamber. A semiconductor wafer before treatment is alternately carried into the first cool chamber or the second cool chamber and then transported to a heat treatment part by a transport robot after a nitrogen purge is performed. The semiconductor wafer after being heat-treated in the heat treatment part is alternately transported to the first cool chamber or the second cool chamber to be cooled. A sufficient cooling time is secured for the independent semiconductor wafer, and a reduction in throughput as the whole heat treatment apparatus can be suppressed.

6 Claims, 14 Drawing Sheets

(51) Int. Cl.
  *H01L 21/677* (2006.01)
  *H01L 21/02* (2006.01)
(52) U.S. Cl.
  CPC .. *H01L 21/67207* (2013.01); *H01L 21/67248* (2013.01); *H01L 21/67745* (2013.01); *H01L 21/02002* (2013.01); *H01L 21/762* (2013.01)

(56) References Cited

U.S. PATENT DOCUMENTS

| | | |
|---|---|---|
| 2009/0197403 A1 | 8/2009 | Honda et al. |
| 2010/0323531 A1 | 12/2010 | Honda et al. |
| 2011/0076117 A1 | 3/2011 | Iizuka |
| 2014/0235072 A1 | 8/2014 | Ito |

FOREIGN PATENT DOCUMENTS

| | | |
|---|---|---|
| JP | 2011-054679 A | 3/2011 |
| JP | 2013-207152 A | 10/2013 |
| JP | 2014-157968 A | 8/2014 |
| TW | 200807556 A | 2/2008 |
| TW | 200836262 A | 9/2008 |
| TW | 201130074 A | 9/2011 |
| WO | 2005/006426 A1 | 1/2005 |

OTHER PUBLICATIONS

Japanese Notice of Reasons for Refusal issued in corresponding Japanese Patent Application No. 2016-130051, dated Oct. 1, 2019, with English translation.

\* cited by examiner

F I G . 7
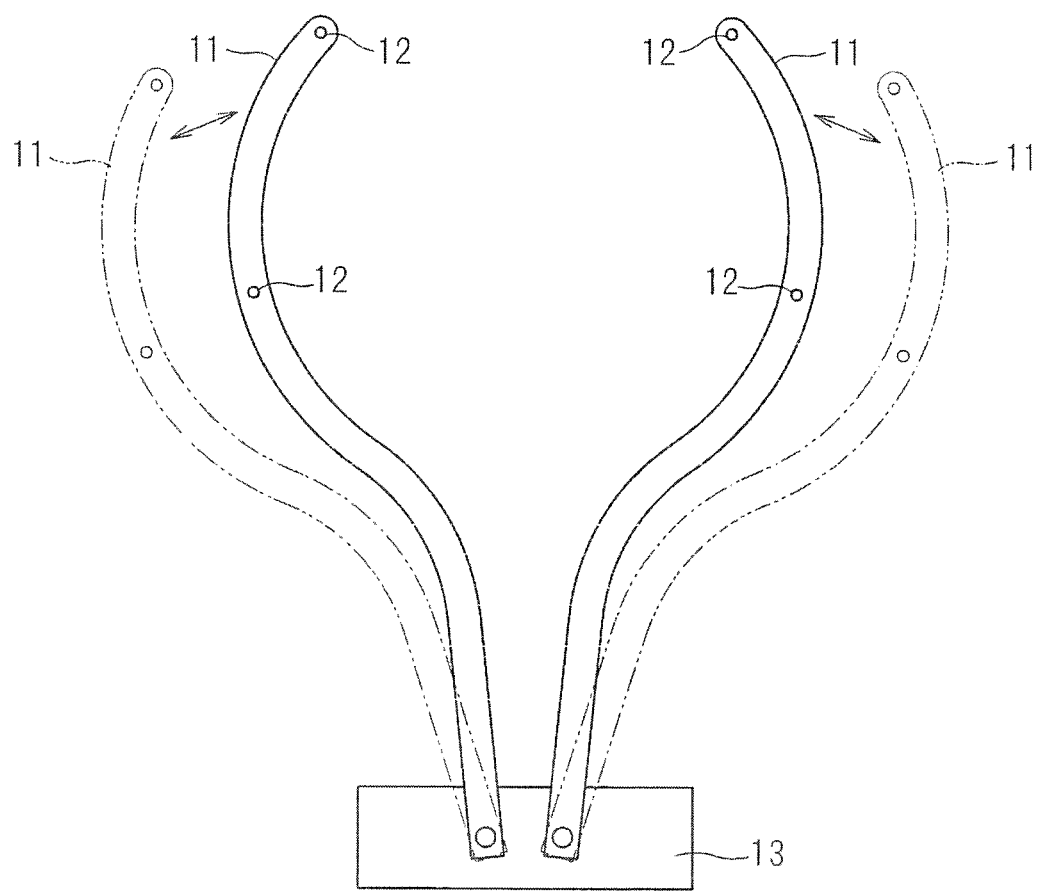

F I G . 8
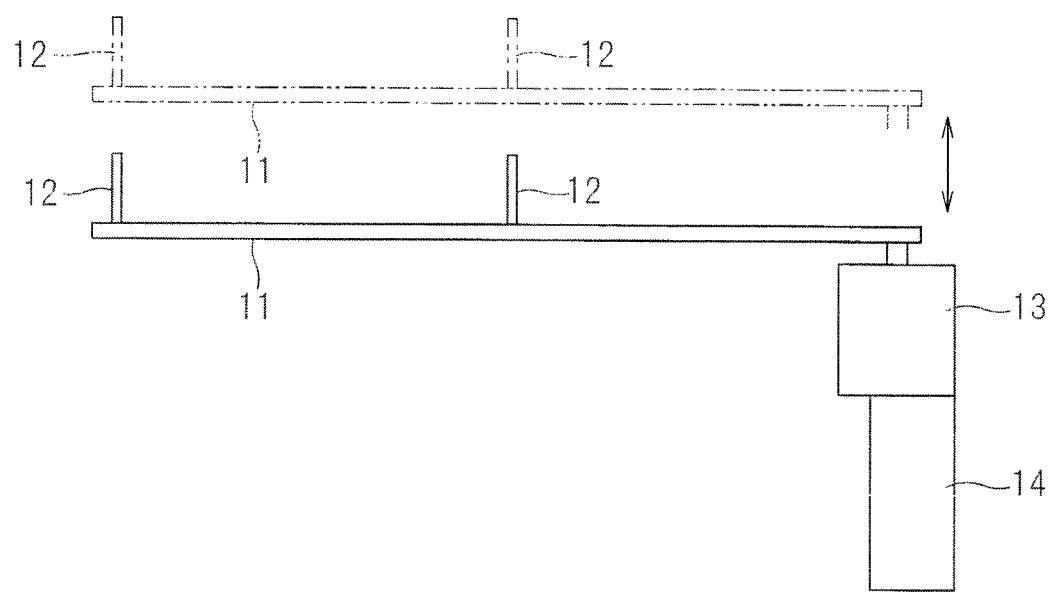

F I G . 1 1
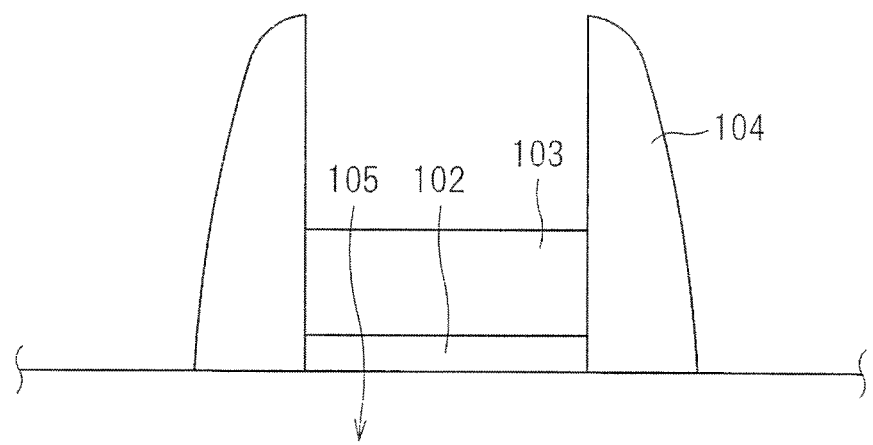

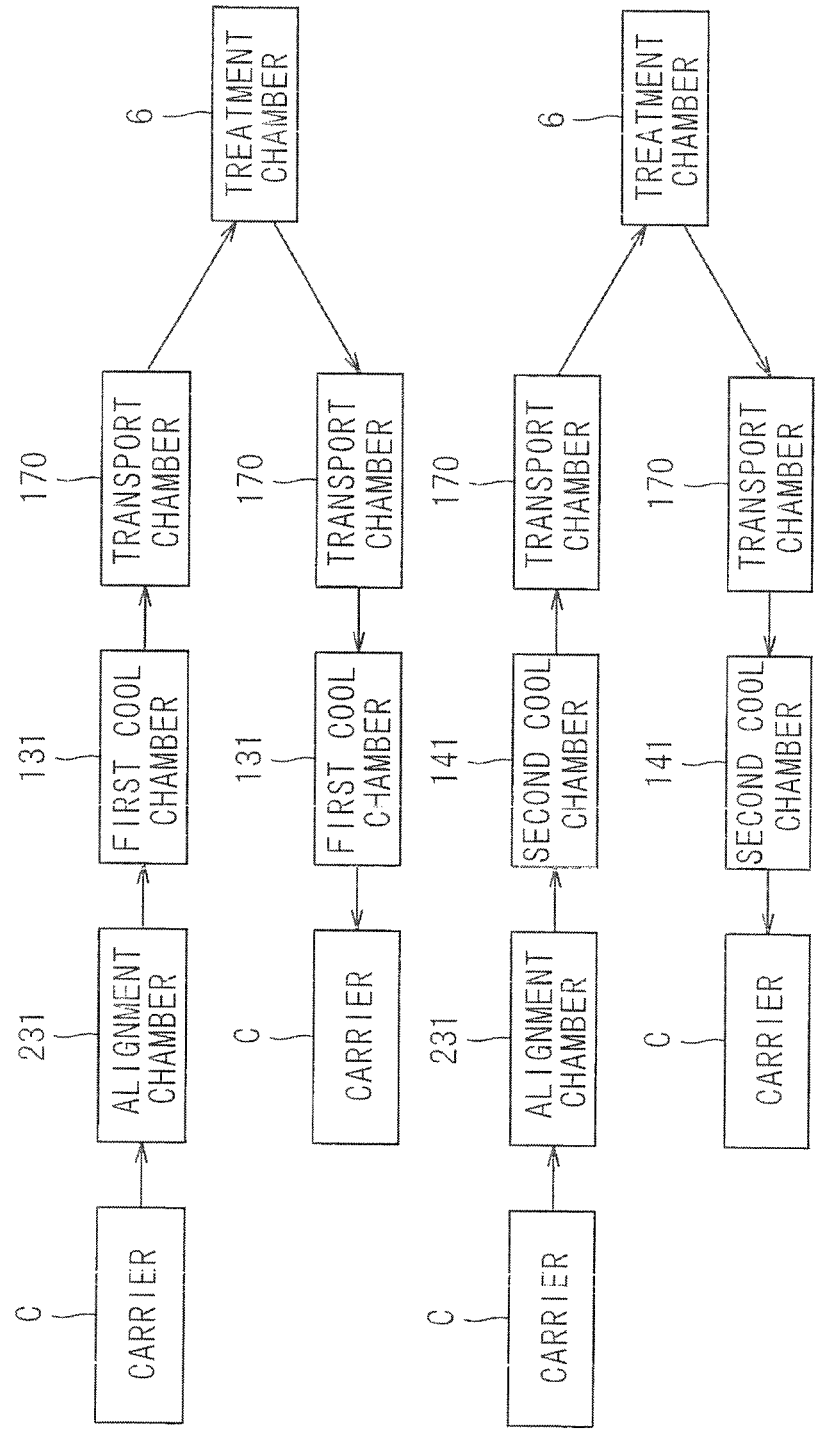

FIG. 13

| TRANSPORT CYCLE | CARRIER C | ALIGNMENT CHAMBER 231 | FIRST COOL CHAMBER 131 | SECOND COOL CHAMBER 141 | TRANSPORT CHAMBER 170 | TREATMENT CHAMBER 6 | FIRST COOL CHAMBER 131 | SECOND COOL CHAMBER 141 | CARRIER C |
|---|---|---|---|---|---|---|---|---|---|
| 0 | W1 | | | | | | | | |
| 1 | W2 | W1 | | | | | | | |
| 2 | W3 | W2 | W1 | | | | | | |
| 3 | W4 | W3 | | W2 | W1 | | | | |
| 4 | W5 | W4 | W3 | | | W1 | | | |
| 5 | W6 | W5 | | W4 | W2 | W2 | | | |
| 6 | W7 | W6 | W5 | | | W3 | W1 | | |
| 7 | W8 | W7 | | W6 | W3 | W4 | | W2 | |
| 8 | W9 | W8 | W7 | | | W5 | W3 | | |
| 9 | W10 | W9 | | W8 | W4 | W6 | | W4 | |
| 10 | W11 | W10 | W9 | | | W7 | W5 | | |
| 11 | W12 | W11 | | W10 | W5 | W8 | | W6 | |
| 12 | W13 | W12 | W11 | | | W9 | W7 | | |
| 13 | W14 | W13 | | W12 | W6 | W10 | | W8 | |
| 14 | W15 | W14 | W13 | | | W11 | W9 | | |
| 15 | W16 | W15 | | W14 | W7 | W12 | | W10 | |
| 16 | W17 | W16 | W15 | | | W13 | W11 | | |
| 17 | W18 | W17 | | W16 | W8 | W14 | | W12 | |
| 18 | W19 | W18 | W17 | | | W15 | W13 | | |
| 19 | W20 | W19 | | W18 | W9 | W16 | | W14 | |
| 20 | W21 | W20 | W19 | | | W17 | W15 | | |
| 21 | W22 | W21 | | W20 | W10 | W18 | | W16 | |
| 22 | W23 | W22 | W21 | | | W19 | W17 | | |
| 23 | W24 | W23 | | W22 | W11 | W20 | | W18 | |
| 24 | W25 | W24 | W23 | | | W21 | W19 | | |
| 25 | | W25 | | W24 | W12 | W22 | | W20 | |
| 26 | | | W25 | | | W23 | W21 | | |
| 27 | | | | | W13 | W24 | | W22 | |
| 28 | | | | | | W25 | W23 | | |
| 29 | | | | | W14 | | | W24 | |
| 30 | | | | | | | W25 | | |

LIGHT-IRRADIATION HEAT TREATMENT METHOD AND HEAT TREATMENT APPARATUS

BACKGROUND OF THE INVENTION

Field of the Invention

The present invention relates to a heat treatment method and a heat treatment apparatus for irradiating a thin-plate-shaped precision electronic substrate (hereinafter referred to simply as a "substrate") such as a semiconductor wafer with a flash of light to heat the substrate.

Description of the Background Art

In a process of manufacturing a semiconductor device, attention has been paid to flash lamp annealing (FLA) that heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising a temperature of only the surface of the semiconductor wafer in an extremely short time (several milliseconds or less).

The xenon flash lamps have a spectral distribution of radiation ranging from ultraviolet to near-infrared regions. The wavelength of the light emitted from the xenon flash lamps is shorter than that of the light emitted from conventional halogen lamps, and substantially coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. It has also turned out that flash irradiation, that is, the irradiation of a semiconductor wafer with a flash of light in an extremely short time of several milliseconds or less allows a selective temperature rise only near the surface of the semiconductor wafer.

Such a flash lamp annealing is used for processes that require heating in an extremely short time, for example, typically for the activation of impurities implanted in a semiconductor wafer. The irradiation of a surface of a semiconductor wafer implanted with impurities by an ion implantation process with a flash of light from flash lamps allows a temperature rise to an activation temperature only in the surface of the semiconductor wafer in an extremely short time, thereby enabling only the activation of impurities without deep diffusion of the impurities.

A heat treatment apparatus having a configuration disclosed in US 2014/0235072, for example, is used for performing the flash lamp annealing. In a flash lamp annealing apparatus disclosed in US 2014/0235072, a cool chamber for performing a cooling treatment of a semiconductor wafer is provided in addition to a treatment chamber for performing the annealing treatment. Typically, in the flash lamp annealing, the semiconductor wafer which is preheated to several hundred ° C. is irradiated with a flash of light, and a surface of the wafer is instantaneously raised to 1000° C. or more. Since such a semiconductor wafer heated to a high temperature cannot be carried outside the apparatus as it is, the semiconductor wafer after being heat-treated is carried into the cool chamber to perform the cooling treatment.

However, it takes considerable time to cool such a high-temperature semiconductor wafer for a reason that the surface of the semiconductor wafer is heated to 1000° C. or more by the flash irradiation, although heated instantaneously. Accordingly, even when the flash heating itself is completed in a short time, it takes considerable time to perform the subsequent cooling treatment, so that a problem arises that a throughput of the whole apparatus is reduced due to the cooling time as a rate-controlling factor.

SUMMARY

The present invention is directed to a heat treatment method of irradiating a substrate with a flash of light to heat the substrate.

According to one aspect of the present invention, a heat treatment method includes steps of : (a) carrying a first substrate before treatment into a first cool chamber and supplying a nitrogen gas to the first cool chamber to replace an atmosphere to a nitrogen atmosphere; (b) taking the first substrate out from the first cool chamber and carrying the first substrate into a treatment chamber connected to a transport chamber using a transport robot which is provided in the transport chamber connected to the first cool chamber; (c) irradiating the first substrate in the treatment chamber with a flash of light to heat the first substrate; (d) carrying the first substrate after heat treatment out of the treatment chamber and delivering the first substrate to the first cool chamber using the transport robot; (e) cooling the first substrate in the first cool chamber and carrying the first substrate after being cooled out of the first cool chamber; (f) carrying a second substrate before treatment into a second cool chamber connected to the transport chamber and supplying a nitrogen gas to the second cool chamber to replace an atmosphere with a nitrogen atmosphere; (g) taking the second substrate out from the second cool chamber and carrying the second substrate into the treatment chamber using the transport robot; (h) irradiating the second substrate in the treatment chamber with a flash of light to heat the second substrate; (i) carrying the second substrate after heat treatment out of the treatment chamber and delivering the second substrate to the second cool chamber using the transport robot; and (j) cooling the second substrate in the second cool chamber and carrying the second substrate after being cooled out of the second cool chamber, wherein steps from the step (a) to the step (e) and steps from the step (f) to the step (j) are alternately repeated.

Since the substrate after being heat treatment is alternately transported to the first cool chamber or the second cool chamber to be cooled, the sufficient cooling time is secured for the independent substrate, and a reduction in throughput as the whole heat treatment apparatus can be suppressed. Moreover, since the substrate before treatment is alternately transported to the first cool chamber or the second cool chamber to replace the atmosphere with the nitrogen atmosphere, the sufficient time for nitrogen purge is secured, and the increase in oxygen concentration in the treatment chamber can be thereby suppressed.

Preferably, the step (c) includes steps of (c-1) reducing a pressure in the treatment chamber which houses the first substrate to a first pressure lower than an atmospheric pressure and (c-2) irradiating a surface of the first substrate with a flash of light from a flash lamp while maintaining the pressure in the treatment chamber at the first pressure, and the step (h) includes steps of (h-1) reducing a pressure in the treatment chamber which houses the second substrate to the first pressure and (h-2) irradiating a surface of the second substrate with a flash of light from the flash lamp while maintaining the pressure in the treatment chamber at the first pressure.

The oxygen concentration in the treatment chamber can be further reduced.

The present invention is also directed to a heat treatment apparatus for irradiating a substrate with a flash of light to heat the substrate.

According to one aspect of the present invention, a heat treatment apparatus includes: a transport chamber including a transport robot; a plurality of cool chambers connected to the transport chamber; a treatment chamber connected to the transport chamber; a flash lamp for irradiating a substrate housed in the treatment chamber with a flash of light to heat the substrate; an atmosphere replacing part for supplying a nitrogen gas to each of the plurality of cool chambers to replace an atmosphere in each of the plurality of cool chambers with a nitrogen atmosphere; and a controller for controlling the transport robot and the atmosphere replacing part so that when a substrate before treatment is carried into one of the plurality of cool chambers in sequence, after a nitrogen gas is supplied to the cool chamber to replace an atmosphere in the cool chamber with a nitrogen atmosphere, the substrate is taken out from the cool chamber and carried into the treatment chamber and the substrate after heat treatment is carried out of the treatment chamber to be delivered to the cool chamber.

Since the substrate after being heat-treated is carried out of the treatment chamber and delivered to one of the plurality of cool chambers to be cooled, the sufficient cooling time is secured for the independent substrate, and the reduction in throughput as the whole heat treatment apparatus can be suppressed. Moreover, since the substrate before treatment is sequentially carried into one of the plurality of cool chambers to replace the atmosphere in the cool chamber with the nitrogen atmosphere, the sufficient time for nitrogen purge is secured, and the increase in oxygen concentration in the treatment chamber can be thereby suppressed.

Preferably, the heat treatment apparatus further includes an exhaust part for exhausting an atmosphere in the treatment chamber, wherein the controller is configured to control the exhaust part so that after a pressure in the treatment chamber is reduced to a first pressure lower than an atmospheric pressure, a surface of the substrate is irradiated with a flash of light from the flash lamp while maintaining the pressure at the first pressure.

The oxygen concentration in the treatment chamber can be further reduced.

The present invention therefore has an object to suppress a reduction in throughput.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a plan view of a transfer mechanism;

FIG. 8 is a side view of the transfer mechanism;

FIG. 11 is a view of stack structure in which a high dielectric constant film is deposited over a semiconductor wafer;

FIG. 12 is a view illustrating a transport order of the semiconductor wafer;

FIG. 13 is a view illustrating a movement of each semiconductor wafer in each transport cycle.

DESCRIPTION OF THE PREFERRED EMBODIMENTS

Figure 1:
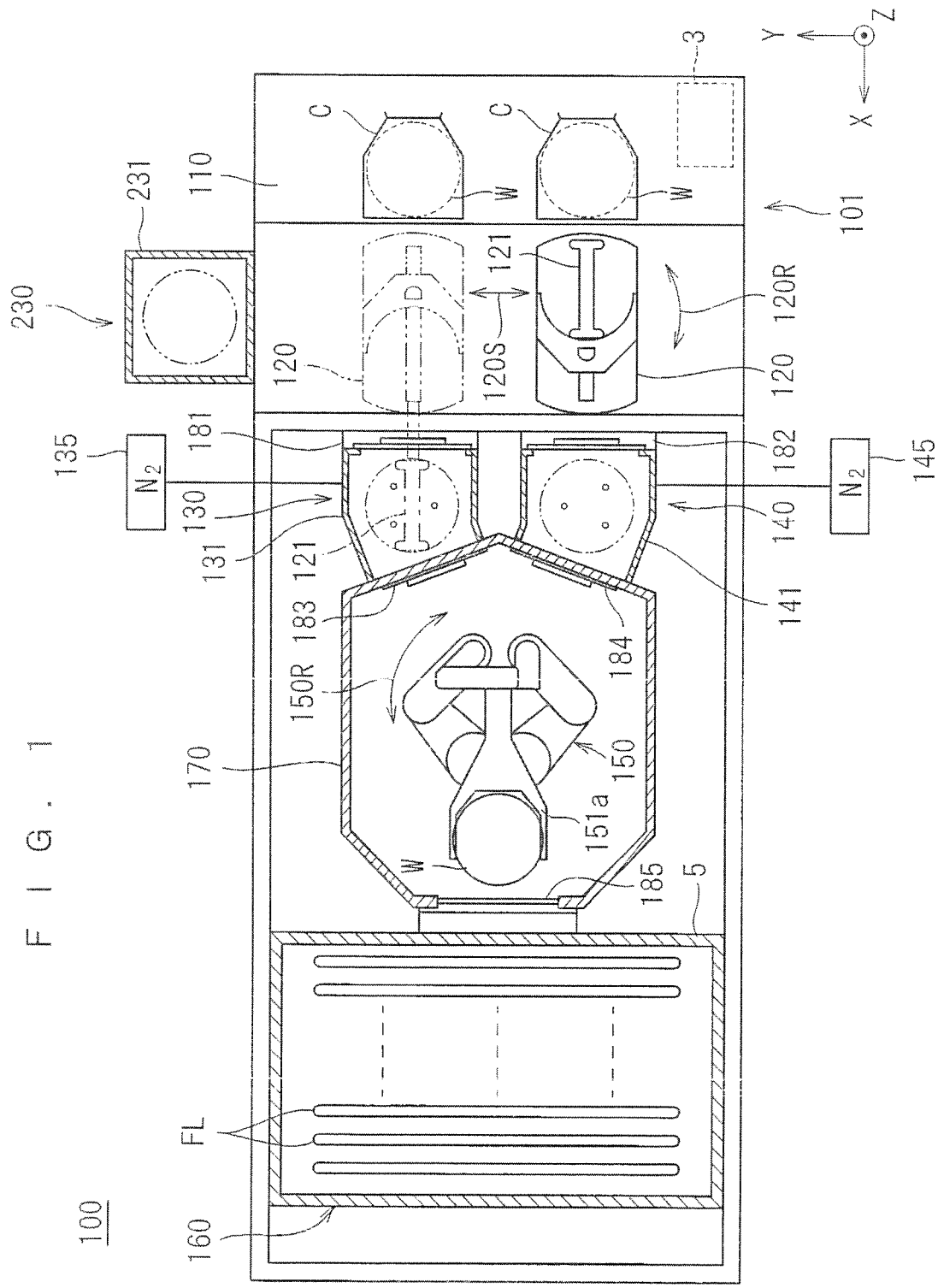
FIG. 1 is a plan view of a heat treatment apparatus according to the present invention.
Figure 2:
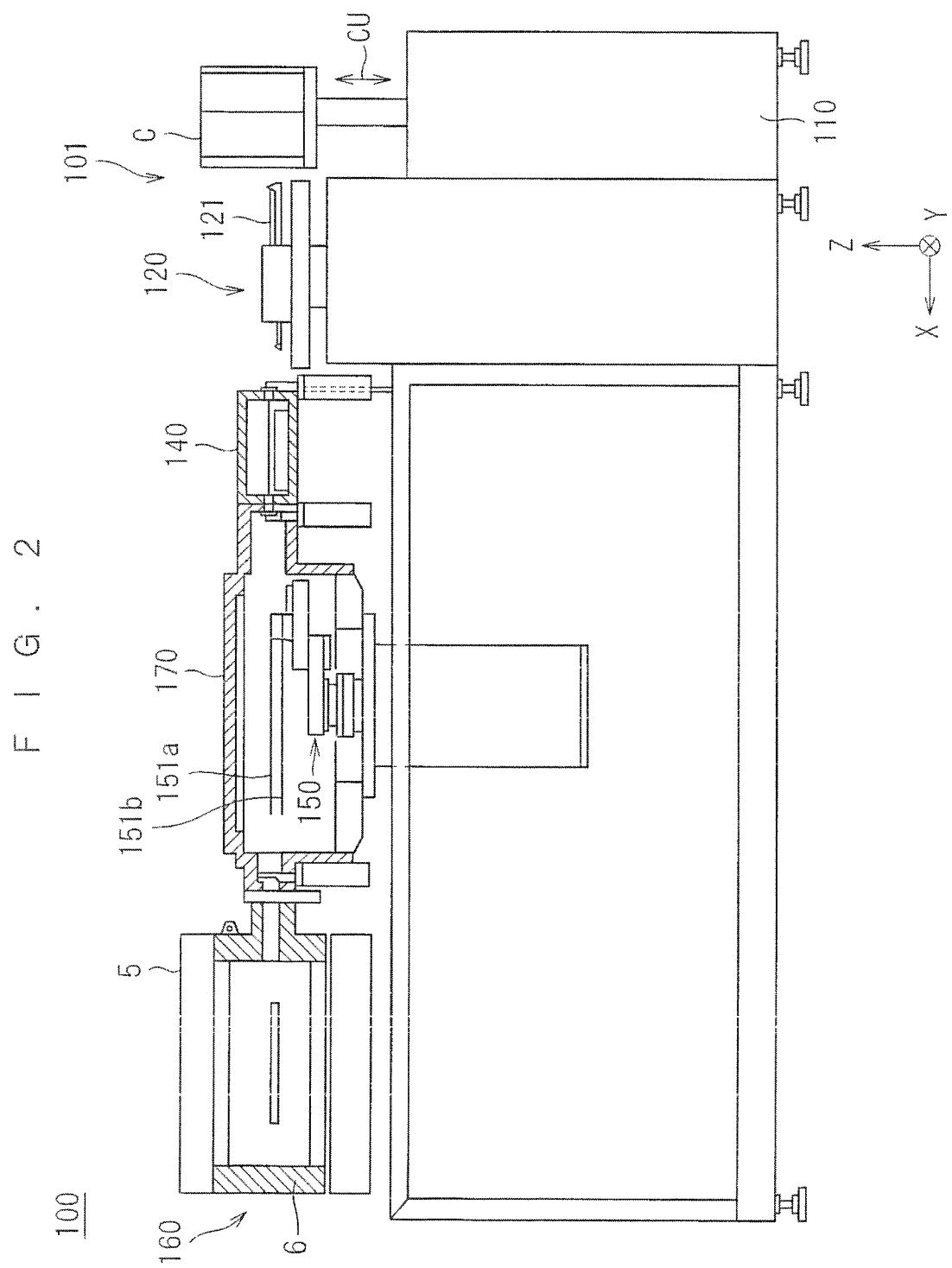
FIG. 2 is a front view of the heat treatment apparatus of FIG. 1.

Preferred embodiments of the present invention will now be described in detail with reference to the drawings. Described firstly is a whole schematic configuration of a heat treatment apparatus 100 according to the present invention. FIG. 1 is a plan view of the heat treatment apparatus 100 according to the present invention, and FIG. 2 is a front view thereof. The heat treatment apparatus 100 is a flash lamp annealer for irradiating a disk-shaped semiconductor wafer W serving as a substrate with a flash of light to heat the semiconductor wafer W. The diameter size of the semiconductor wafer W to be treated is not particularly limited, which is, for example, 300 or 450 mm. The semiconductor wafer W before being transported into the heat treatment apparatus 100 has a high dielectric constant film deposited thereover, and the heat treatment apparatus 100 performs post deposition annealing (PDA) on the high dielectric constant film through a heat treatment. For easy understanding, the dimensions and the numbers of respective constituent elements may be exaggerated or simplified as necessary in FIG. 1 and subsequent drawings. In FIG. 1 and FIG. 2, an X-Y-Z rectangular coordinate system in which a Z axis direction is defined as a vertical direction and an X-Y plane is defined as a horizontal plane is illustrated to clarify a directional relationship of FIG. 1 and FIG. 2.

As shown in FIG. 1 and FIG. 2, the heat treatment apparatus 100 includes an indexer 101 which carries the untreated semiconductor wafer W from outside into the apparatus and carries the treated semiconductor wafer W outside the apparatus, an alignment part 230 which performs an alignment of the untreated semiconductor wafer W, two cooling parts 130 and 140 which cool the semiconductor wafer W after being heat-treated, a heat treatment part 160 which performs a flash heating treatment on the semiconductor wafer W, and a transport robot 150 which transports the semiconductor wafer W from/to the cooling parts 130 and 140 and heat treatment part 160. The heat treatment apparatus 100 further includes a controller 3 which controls operating mechanisms located in each treatment part described above and the transport robot 150 to promote the flash heating treatment of the semiconductor wafer W.

The indexer 101 includes a load port 110 which arranges a plurality of carriers C (two in the present preferred embodiment) side by side and a delivery robot 120 which takes out the untreated semiconductor wafer W from each carrier C and houses the treated semiconductor wafer W in each carrier C. The carrier C which houses the untreated semiconductor wafer W is transported by an automatic guided vehicle (AGV and OHT) or the like and disposed on the load port 110, and the carrier C which houses the treated semiconductor wafer W is taken out from the load port 110 by the automatic guided vehicle.

In the load port 110, the carrier C is configured to be able to move up and down as shown by an arrow CU of FIG. 2 so that the delivery robot 120 can take the optional semiconductor wafer W in and out from the carrier C. Besides a FOUP (front opening unified pod) which houses the semiconductor wafer W in an enclosed space, a SMIF (Standard Mechanical Inter Face) pod or an OC (open cassette) which exposes the housed semiconductor wafer W outside may be applied as the configuration of the carrier C.

The delivery robot 120 can perform a slide movement as shown by an arrow 120S of FIG. 1, a pivot operation as shown by an arrow 120R of FIG. 1, and an elevating operation. The delivery robot 120 thereby takes the semiconductor wafer W in and out from the two carriers C and transports the semiconductor wafer W from/to the alignment part 230 and two cooling parts 130 and 140. The semiconductor wafer W is taken in and out from the carrier C by the delivery robot 120 using the slide movement of a hand 121 and an elevating movement of the carrier C. The semiconductor wafer W is transported between the delivery robot 120 and the alignment part 230 or cooling parts 130 and 140 using the slide movement of the hand 121 and the elevating operation of the delivery robot 120.

The alignment part 230 is located on one side of the indexer 101 along the Y axis direction. The alignment part 230 is a treatment part to rotate the semiconductor wafer W in the horizontal plane to adjust the semiconductor wafer W in a direction appropriate for the flash heating. The alignment part 230 includes, in an alignment chamber 231 which is an enclosure made of aluminum alloy, a mechanism for supporting the semiconductor wafer W in a horizontal position and rotating it and a mechanism for optically detecting a notch and an orientation flat, for example, formed in a peripheral part of the semiconductor wafer W.

The semiconductor wafer W is transported to the alignment part 230 by the delivery robot 120. The semiconductor wafer W is transported from the delivery robot 120 to the alignment chamber 231 so that a center of the wafer is located in a predetermined position. The alignment part 230 rotates the semiconductor wafer W received from the indexer 101 around the center of the semiconductor wafer W in the vertical direction and optically detects the notch, for example, to adjust the direction of the semiconductor wafer W. The semiconductor wafer W whose direction has been adjusted is taken out from the alignment chamber 231 by the delivery robot 120.

A transport chamber 170 which houses the transport robot 150 is provided as a transport space of the semiconductor wafer W transported by the transport robot 150. A treatment chamber 6 of the heat treatment part 160, a first cool chamber 131 of the cooling part 130, and a second cool chamber 141 of the cooling part 140 are communicatively connected to three sides of the transport chamber 170.

The heat treatment part 160, which constitutes a main part of the heat treatment apparatus 100, is a substrate treatment part to irradiate the preheated semiconductor wafer W with a flash light (the flash of light) emitted from a xenon flash lamp FL for the flash heating treatment. The configuration of the heat treatment part 160 is described in detail hereinafter.

The two cooling parts 130 and 140 have substantially a similar configuration. The cooling part 130 has a configuration that a quartz plate is disposed on an upper surface of a metal cooling plate in the first cool chamber 131 which is an enclosure made of aluminum alloy. Similarly, the cooling part 140 has a configuration that a quartz plate is disposed on an upper surface of a metal cooling plate in the second cool chamber 141 which is an enclosure made of aluminum alloy. The cooling plate is temperature-adjusted to room temperature (approximately 23° C.) by a Peltier element or a constant temperature water circulating system. Since the semiconductor wafer W immediate after the flash heating treatment in the heat treatment part 160 has a high temperature, the semiconductor wafer W is disposed and cooled on the quartz plate in the cooling parts 130 and 140.

Nitrogen gas is supplied from a nitrogen supply part 135 to the first cool chamber 131. Nitrogen gas is supplied from a nitrogen supply part 145 to the second cool chamber 141. The excess nitrogen gas supplied to the first cool chamber 131 and second cool chamber 141 is appropriately exhausted from an exhaust pipe. Atmosphere in the first cool chamber 131 and second cool chamber 141 can be replaced with a nitrogen atmosphere by supplying the nitrogen gas from the nitrogen supply parts 135 and 145.

The transport robot 150 provided in the transport chamber 170 can pivot as shown by an arrow 150R around an axis along the vertical direction. The transport robot 150 has two link mechanisms made up of a plurality of arm segments, and transport hands 151a and 151b which hold the semiconductor wafer W are provided in a tip portion of the two link mechanism, respectively. The transport hands 151a and 151b are disposed with a predetermined pitch in the vertical direction, and the link mechanisms enable an independent linear slide movement of the transport hands 151a and 151b in the same horizontal direction. The transport robot 150 moves up and down a base in which the two link mechanism are provided, thereby moving up and down the two transport hands 151a and 151b while keeping the predetermined pitch therebetween.

When the transport robot 150 transports (takes in and out) the semiconductor wafer W from/to the first cool chamber 131, the second cool chamber 141, or the treatment chamber 6 of the heat treatment part 160 as the other side for the transport, the both transport hands 151a and 151b firstly pivot to face the other side for the transport and after the pivot (or during the pivot), move up and down to be located at a height at which one of the transport hands transports the semiconductor wafer W from/to the other side for the transport. Subsequently, the transport hands 151a (151b) performs the linear slide movement in the horizontal direction to transport the semiconductor wafer W from/to the other side for the transport.

The semiconductor wafer W is transported between the transport robot 150 and the delivery robot 120 via the cooling part 130 and 140. That is to say, the two cooling parts 130 and 140 also serve as a path for transporting the semiconductor wafer W between the transport robot 150 and the delivery robot 120. Specifically, two carrying-in/out port are provided in the first cool chamber 131 and the second cool chamber 141, and the transport robot 150 inserts the transport hands 151a and 151b from one of the carrying-in/out ports and the delivery robot 120 inserts the hand 121 from the other carrying-in/out port. Then, the semiconductor wafer W transported from one of the transport robot 150 and the delivery robot 120 to the first cool chamber 131 or the second cool chamber 141 is received by the other one of the transport robot 150 and the delivery robot 120, thereby being transported.

Gate valves 181 and 182 are provided between the first cool chamber 131 and the indexer 101 and between the second cool chamber 141 and the indexer 101, respectively. Gate valves 183 and 184 are provided between the transport chamber 170 and the first cool chamber 131 and between the transport chamber 170 and the second cool chamber 141, respectively. Furthermore, a gate valve 185 is provided between the transport chamber 170 and the treatment chamber 6 of the heat treatment part 160. When the semiconductor wafer W is transported in the heat treatment apparatus 100, these valves are appropriately opened and closed.

Since a high-purity nitrogen gas is also supplied from a nitrogen supply part not shown in the drawings to the transport chamber 170 and the alignment chamber 231, in a manner similar to the first cool chamber 131 and the second cool chamber 141, a clean atmosphere is maintained in the transport chamber 170 and the alignment chamber 231.

Figure 3:
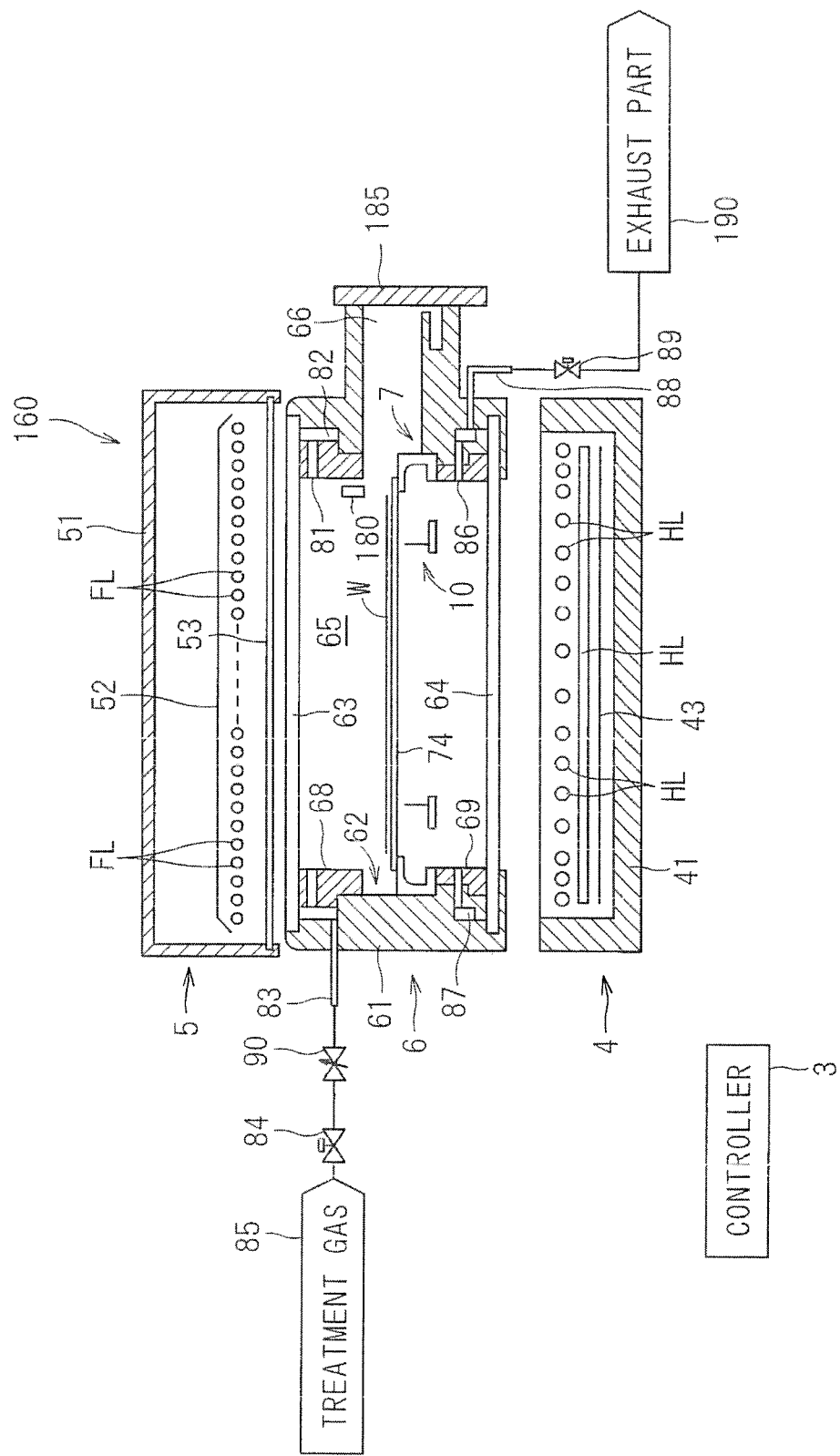
FIG. 3 is a longitudinal cross-sectional view of a configuration of a heat treatment part.

Next, the configuration of the heat treatment part 160 is described. FIG. 3 is a longitudinal cross-sectional view of the configuration of the heat treatment part 160. The heat treatment part 160 includes the treatment chamber 6 which houses the semiconductor wafer W, a flash heating part 5 with a plurality of built-in flash lamps FL, and a halogen heating part 4 with a plurality of built-in halogen lamps HL. The flash heating part 5 is located above the chamber 6, and the halogen heating part 4 is located below the treatment chamber 6. The heat treatment part 160 further includes, within the treatment chamber 6, a holder 7 which holds the semiconductor wafer W in a horizontal position and a transfer mechanism 10 which transports the semiconductor wafer W between the holder 7 and the outside of the heat treatment part 160.

The treatment chamber 6 is configured such that chamber windows made of quartz are mounted to a top and bottom of a tubular chamber side portion 61. The chamber side portion 61 has a substantially tubular shape having an open top and an open bottom. An upper chamber window 63 is mounted to block the top opening of the chamber side portion 61, and a lower chamber window 64 is mounted to block the bottom opening thereof. The upper chamber window 63 forming the ceiling of the treatment chamber 6 is a disk-shaped member made of quartz and serves as a quartz window which transmits a flash of light emitted from the flash heating part 5 therethrough into the treatment chamber 6. The lower chamber window 64 forming the floor of the treatment chamber 6 is also a disk-shaped member made of quartz and serves as a quartz window which transmits light emitted from the halogen heating part 4 therethrough into the treatment chamber 6. The upper chamber window 63 and the lower chamber window 64 have a thickness of, for example, approximately 35 mm.

The reflection ring 68 is mounted to an upper portion of the inner wall surface of the chamber side portion 61, and a reflection ring 69 is mounted to a lower portion thereof. The reflection rings 68 and 69 are each in the form of an annular ring. The reflection ring 68 on the top is mounted by being inserted downwardly from the top of the chamber side portion 61. The reflection ring 69 on the bottom, on the other hand, is mounted by being inserted upwardly from the bottom of the chamber side portion 61 and fastened with screws (not shown). In other words, the reflection rings 68 and 69 are each removably mounted to the chamber side portion 61. An interior space of the treatment chamber 6, or, a space surrounded by the upper chamber window 63, the lower chamber window 64, the chamber side portion 61, and the reflection rings 68 and 69, is defined as a heat treatment space 65.

A recessed portion 62 is defined in the inner wall surface of the treatment chamber 6 by mounting the reflection rings 68 and 69 to the chamber side portion 61. That is to say, the recessed portion 62 is defined which is surrounded by a middle portion of the inner wall surface of the chamber side portion 61 where the reflective rings 68 and 69 are not mounted, a lower end surface of the reflection ring 68, and an upper end surface of the reflection ring 69. The recessed portion 62 is horizontally formed in an annular shape in the inner wall surface of the chamber 6 and surrounds the holder 7 which holds the semiconductor wafer W.

The chamber side portion 61 and the reflection rings 68 and 69 are made of metal material (e.g., stainless steel) with high strength and high heat resistance.

The chamber side portion 61 is provided with a transport opening (throat) 66 for carrying the semiconductor wafer W therethrough into and out of the treatment chamber 6. The transport opening 66 is openable and closable by the gate valve 185. The transport opening 66 is communicatively connected to an outer peripheral surface of the recessed portion 62. Thus, when the transport opening 66 is opened by the gate valve 185, the semiconductor wafer W is allowed to be carried through the transport opening 66 and the recessed portion 62 into and out of the heat treatment space 65. When the transport opening 66 is closed by the gate valve 185, the heat treatment space 65 in the treatment chamber 6 is an enclosed space.

The upper portion of the inner wall of the treatment chamber 6 has a gas supply port 81 through which a treatment gas (in the present preferred embodiment, nitrogen gas ($N_2$)) is supplied into the heat treatment space 65. The gas supply port 81 is located at a position above the recessed portion 62 and may be located in the reflection ring 68. The gas supply port 81 is communicatively connected to a gas supply pipe 83 via a buffer space 82 which is formed in an annular shape inside the side wall of the treatment chamber 6. The gas supply pipe 83 is connected to a gas supply source 85. The gas supply source 85 supplies the gas supply pipe 83 with a nitrogen gas as a treatment gas under the control of the controller 3. Also, a valve 84 and a flow regulating valve 90 are interposed in the path of the gas supply pipe 83. When the valve 84 is opened, a treatment gas is supplied from the gas supply source 85 into the buffer space 82. The flow rate of the treatment gas flowing through the gas supply pipe 83 to the buffer space 82 is regulated by the flow regulating valve 90. The flow rate of the treatment gas determined by the flow regulating valve 90 is variable through the control of the controller 3. The treatment gas flowing in the buffer space 82 flows in a spreading manner within the buffer space 82 that is lower in fluid resistance than the gas supply port 81, and is supplied through the gas supply port 81 into the heat treatment space 65. It should be noted that the treatment gas is not limited to the nitrogen gas, but may be inert gases such as argon (Ar) and helium (He), and reactive gases such oxygen ($O_2$), hydrogen ($H_2$), chlorine ($Cl_2$), hydrogen chloride (HCl), ozone ($O_3$), carbon monoxide (NO), nitrous oxide ($N_2O$), and nitrogen dioxide ($NO_2$).

The lower portion of the inner wall of the treatment chamber 6 has a gas exhaust port 86 through which the gas in the heat treatment space 65 is exhausted. The gas exhaust port 86 is located at a position below the recessed portion 62 and may be located in the reflection ring 69. The gas exhaust port 86 is communicatively connected to a gas exhaust pipe 88 via a buffer space 87 which is formed in an annular shape inside the side wall of the treatment chamber 6. The gas exhaust pipe 88 is connected to an exhaust part 190. A valve 89 is interposed in the path of the gas exhaust pipe 88. When the valve 89 is opened, the gas in the heat treatment space 65 is exhausted from the gas exhaust port 86 through the buffer space 87 into the gas exhaust pipe 88. Alternatively, a plurality of gas supply ports 81 and a plurality of gas exhaust ports 86 may be provided along the circumference of the treatment chamber 6, or the gas supply port 81 and the gas exhaust port 86 may be slit-shaped.

Figure 10:
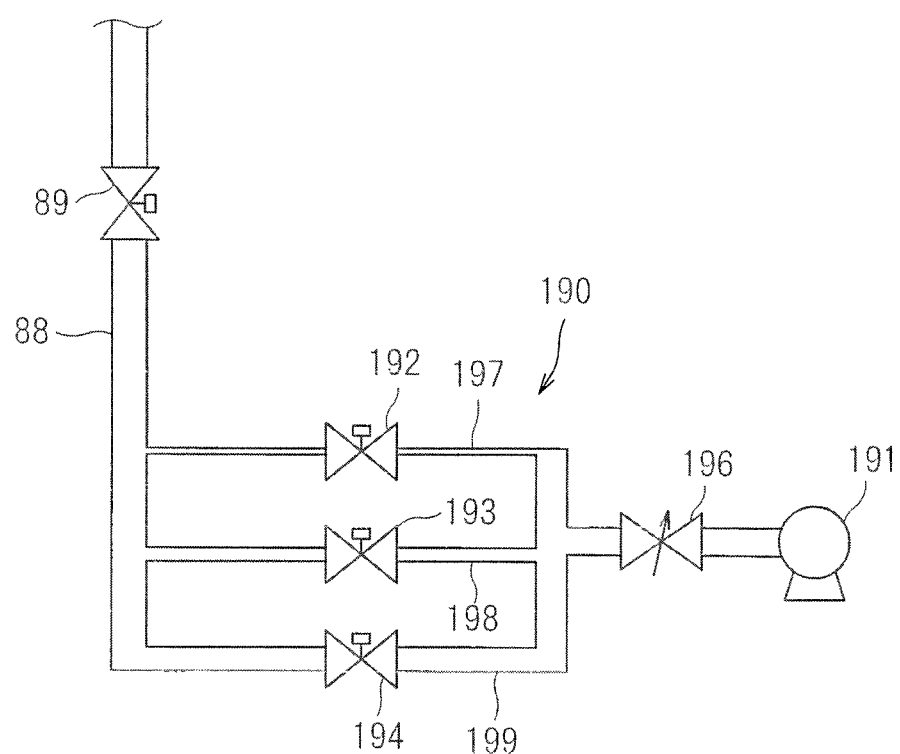
FIG. 10 is a view of a configuration of an exhaust part.

FIG. 10 is a view of a configuration of the exhaust part 190. The exhaust part 190 includes an exhaust pump 191, a flow regulating valve 196, three bypass lines 197, 198, and 199, and three exhaust valves 192, 193, and 194. The gas exhaust pipe 88 guiding the gas exhausted from the treatment chamber 6 is connected through the three bypass lines 197, 198, and 199 to the exhaust pump 191. The three bypass lines 197, 198, and 199 are provided in parallel with each other. The three bypass lines 197, 198, and 199 are different in pipe diameter from each other. The bypass line 197 has the smallest diameter, and the bypass line 199 has the largest diameter. The bypass line 198 has a diameter intermediate between the diameters of the bypass lines 197 and 199. Thus, the flow rate of the gas that can pass through the bypass line increases in the order of the bypass lines 197, 198, and 199.

The three exhaust valves 192, 193, and 194 are provided respectively in the three bypass lines 197, 198, and 199. Specifically, the exhaust valve 192 is interposed in the bypass line 197, the exhaust valve 193 is interposed in the bypass line 198, and the exhaust valve 194 is interposed in the bypass line 199. When the three exhaust valves 192, 193, and 194 are opened while the exhaust pump 191 is operated, the gas exhausted from the treatment chamber 6 and guided by the gas exhaust pipe 88 passes through the corresponding bypass lines 197, 198, and 199 and is then sucked by the exhaust pump 191.

The three bypass lines 197, 198, and 199, which have different pipe diameters, are different in exhaust capability from each other. The exhaust capability increases as the pipe diameter increases. The exhaust capability increases in the order of the bypass lines 197, 198, and 199. Thus, the exhaust flow rate from the treatment chamber 6 can be controlled by opening or closing any of the three exhaust valves 192, 193, and 194. Any one of the three exhaust valves 192, 193, and 194 may be opened. Alternatively, two or all of the three exhaust valves 192, 193, and 194 may be opened. For example, when the exhaust valves 193 and 194 are closed and only the exhaust valve 192 is opened, the gas is exhausted at the lowest exhaust flow rate. When all the three exhaust valves 192, 193, and 194 are opened, the gas is exhausted at the highest exhaust flow rate.

The flow regulating valve 196 is interposed between the exhaust pump 191 and the joint portion of the three bypass lines 197, 198, and 199. The exhaust flow rate in the gas exhaust pipe 88 is also regulatable by the flow regulating valve 196. The exhaust flow rate determined by the flow regulating valve 196 is variable through the control of the controller 3. While the three bypass lines 197, 198, and 199 constitute a mechanism which regulates the exhaust flow rate in a discontinuous and multi-step manner, the flow regulating valve 196 constitutes a mechanism which regulates the exhaust flow rate in a continuous and stepless manner.

The gas supply pipe 83, the gas exhaust pipe 88, and the three bypass lines 197, 198, and 199 are made of stainless steel with high strength and high resistance to corrosion. A pressure gauge 180 for measuring the pressure in the heat treatment space 65 is provided in the treatment chamber 6. The pressure gauge 180 preferably has a measurement range of approximately 5 Pa to 0.2 MPa.

Figure 4:
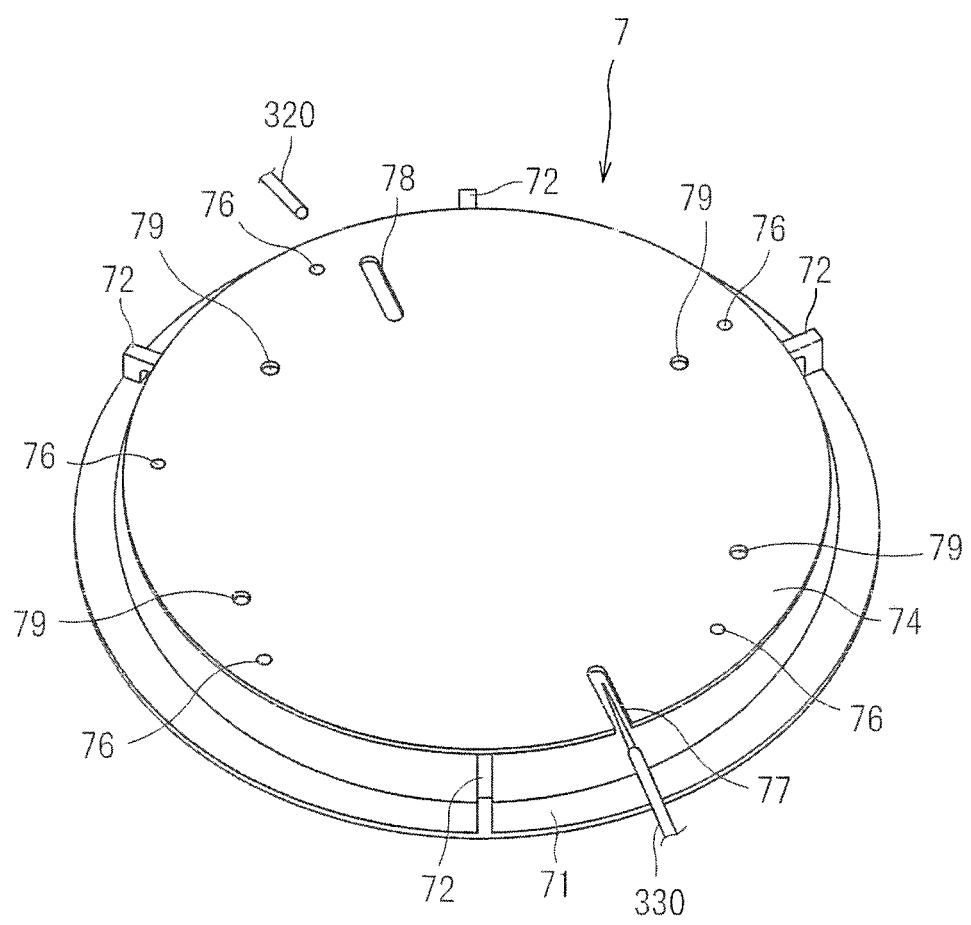
FIG. 4 is a perspective view of a whole appearance of a holder.
Figure 5:
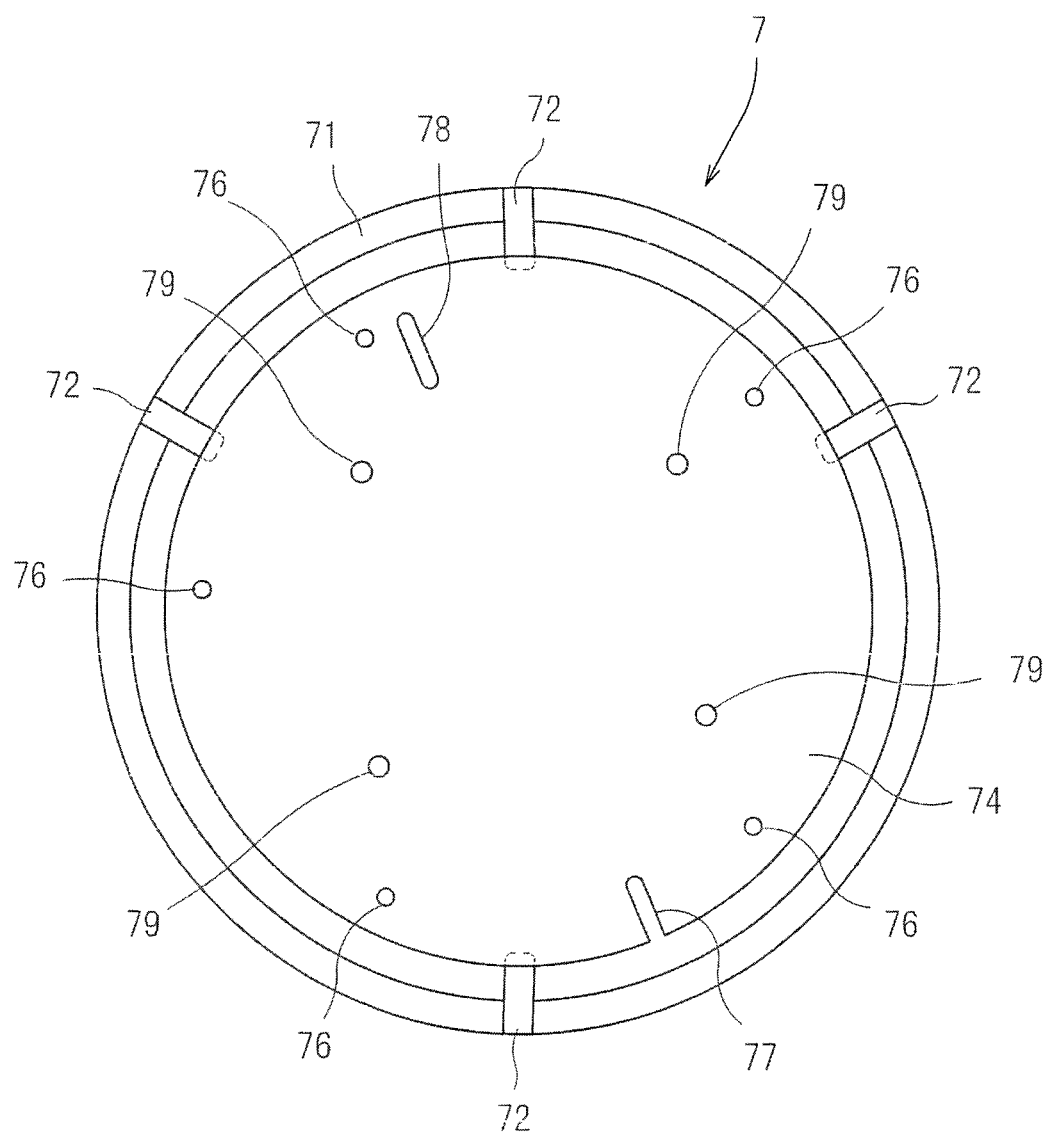
FIG. 5 is a plan view of the holder as seen from above.
Figure 6:
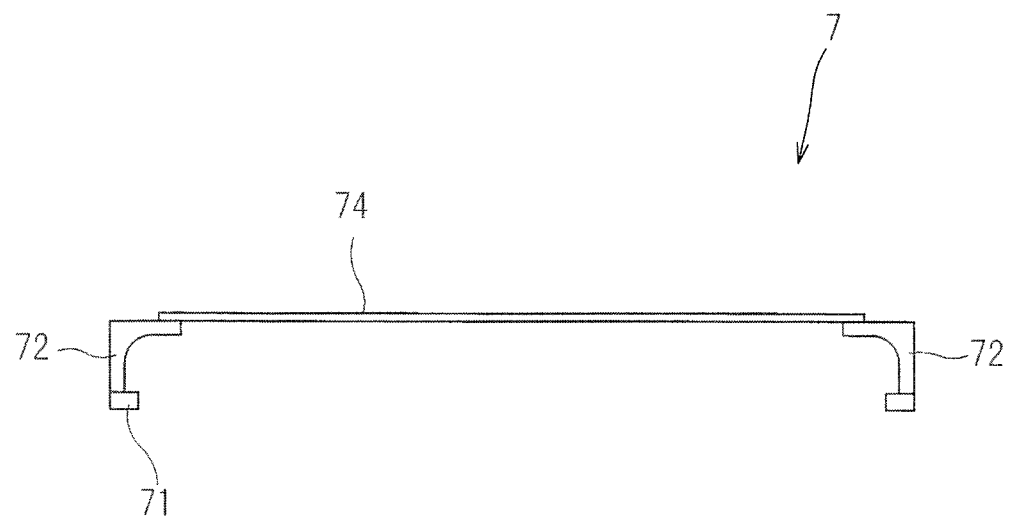
FIG. 6 is a side view of the holder as seen from one side.

FIG. 4 is a perspective view of the entire external appearance of the holder 7. FIG. 5 is a plan view of the holder 7 as seen from the above. FIG. 6 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the treatment chamber 6 by being disposed on the bottom surface of the recessed portion 62 (see FIG. 3). The plurality of (in the present preferred embodiment, four) coupling portions 72 are mounted upright on the upper surface of the base ring 71 in the form of an annular ring and arranged in a circumferential direction of the base ring 71. The coupling portions 72 are also quartz members, and are rigidly secured to the base ring 71 by welding. The base ring 71 may have an arc shape that is an annular shape with a missing part.

The susceptor 74 having a planar shape is supported by the four coupling portions 72 provided on the base ring 71. The susceptor 74 is a substantially circular planar member made of quartz. The diameter of the susceptor 74 is greater than that of the semiconductor wafer W. In other words, the susceptor 74 has a size, as seen in a plan view, greater than that of the semiconductor wafer W. A plurality of (in the present preferred embodiment, five) guide pins 76 are mounted upright on the upper surface of the susceptor 74. The five guide pins 76 are located along the circumference of a circle concentric with the outer circumference of the susceptor 74. The diameter of a circle on which the five guide pins 76 are located is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by, for example, welding.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the treatment chamber 6, whereby the holder 7 is mounted to the chamber 6. With the holder 7 mounted to the chamber 6, the susceptor 74 of a substantially disk-shaped configuration is held in the horizontal position (the position in which the normal to the susceptor 74 coincides with a vertical direction). A semiconductor wafer W carried into the treatment chamber 6 is disposed and held in the horizontal position on the susceptor 74 of the holder 7 mounted to the treatment chamber 6. The semiconductor wafer W is disposed inside the circle defined by the five guide pins 76. This prevents a positional deviation of the semiconductor wafer W in the horizontal direction. The number of guide pins 76 is not limited to five and may be determined so as to prevent a positional deviation of the semiconductor wafer W.

As shown in FIG. 4 and FIG. 5, an opening 78 and a cut-out portion 77 are provided in the susceptor 74 which vertically penetrate the susceptor 74. The cut-out portion 77 is provided to allow a distal end portion of a probe of a contact-type thermometer 330 including a thermocouple to pass therethrough. The opening 78 is provided for a radiation thermometer 320 to receive radiation (infrared radiation) emitted from the lower surface of the semiconductor wafer W held by the susceptor 74. The susceptor 74 further has four through holes 79 through which lift pins 12 of the transfer mechanism 10, which will be described below, pass to transport the semiconductor wafer W.

FIG. 7 is a plan view of the transfer mechanism 10. FIG. 8 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the pair of lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 7) in which a semiconductor wafer W is transferred to and from the holder 7 and a retracted position (a position indicated by dashed double-dotted lines in FIG. 7) in which the transfer arms 11 do not overlap the semiconductor wafer W held by the holder 7 as seen in a plan view. The horizontal movement mechanism 13 may be a mechanism for separately pivoting the transfer arms 11 by individual motors or a mechanism for pivoting the pair of transfer arms 11 in conjunction with each other by a single motor using a link mechanism.

The pair of transfer arms 11 are movable upward and downward together with the horizontal movement mechanism 13 by an elevating mechanism 14. When the elevating mechanism 14 moves up the pair of transfer arms 11 in their transfer operation position, the four lift pins 12 in total pass through the respective four through holes 79 (see FIG. 4 and FIG. 5) bored in the susceptor 74, so that the upper ends of the lift pins 12 protrude from the upper surface of the susceptor 74. On the other hand, when the elevating mechanism 14 moves down the pair of transfer arms 11 in their transfer operation position to take the lift pins 12 out from the respective through holes 79 and the horizontal movement mechanism 13 moves the pair of transfer arms 11 so as to open the transfer arms 11, the transfer arms 11 move to their retracted position. The retracted position of the pair of transfer arms 11 is directly above the base ring 71 of the holder 7. The base ring 71 is disposed on the bottom surface of the recessed portion 62, and thus, the retracted position of the transfer arms 11 is inside the recessed portion 62.

Referring back to FIG. 3, the flash heating part 5 provided over the treatment chamber 6 includes an enclosure 51, a light source provided inside the enclosure 51 and including the plurality of (in the present preferred embodiment, 30) xenon flash lamps FL, and a reflector 52 provided inside the enclosure 51 so as to cover the light source from above. The flash heating part 5 further includes a lamp light irradiation window 53 mounted to the bottom of the enclosure 51. The lamp light irradiation window 53 forming the floor of the flash heating part 5 is a plate-shaped quartz window made of quartz. The flash heating part 5 is provided over the treatment chamber 6, whereby the lamp light irradiation window 53 is opposed to the upper chamber window 63. The flash lamps FL emit a flash of light from over the treatment chamber 6 through the lamp light irradiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are parallel with each other along the main surface of the semiconductor wafer W held by the holder 7 (i.e., in a horizontal direction). Thus, a plane defined by the arrangement of the flash lamps FL is also a horizontal plane.

Each of the xenon flash lamps FL includes a rod-shaped glass tube (discharge tube) and a trigger electrode. The glass tube contains a xenon gas sealed therein and has positive and negative electrodes provided on opposite ends thereof and connected to a capacitor. The trigger electrode is attached to the outer peripheral surface of the glass tube. The xenon gas is electrically insulative, and thus, no current flows in the glass tube in a normal state even when electrical charge is stored in the capacitor. However, if a high voltage is applied to the trigger electrode to cause an electrical breakdown, the electricity stored in the capacitor flows momentarily in the glass tube, and xenon atoms or molecules are excited at this time to cause light emission. Such a xenon flash lamp FL has the property of being capable of emitting extremely intense light compared with a light source that stays lit continuously, such as a halogen lamp HL, because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable in accordance with the coil constant of a lamp light source which supplies power to the flash lamps FL.

The reflector 52 is provided over the plurality of flash lamps FL so as to cover all the flash lamps FL. A fundamental function of the reflector 52 is to reflect flashes of light emitted from the plurality of flash lamps FL toward the heat treatment space 65. The reflector 52 is a plate made of aluminum alloy. A surface of the reflector 52 (a surface which faces the flash lamps FL) is roughened by blasting.

The halogen heating part 4 provided below the treatment chamber 6 includes a plurality of (in the present preferred embodiment, 40) built-in halogen lamps HL inside an enclosure 41. The halogen heating part 4 is a light irradiator which emits light from under the treatment chamber 6 through the lower chamber window 64 toward the heat treatment space 65 to heat the semiconductor wafer W by means of the halogen lamps HL.

Figure 9:
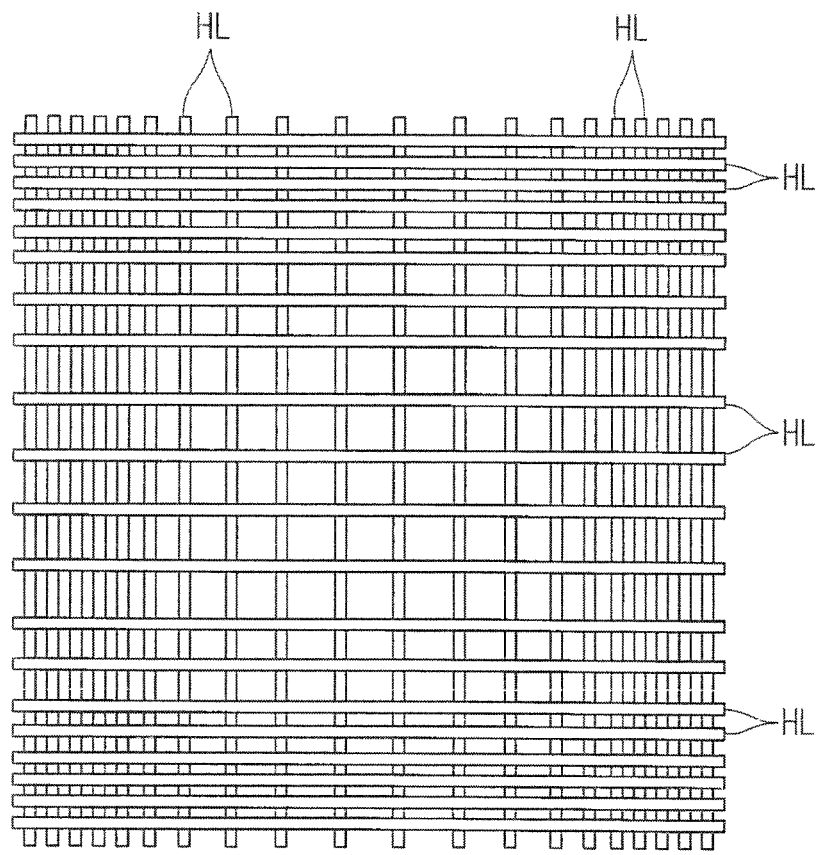
FIG. 9 is a plan view of an arrangement of halogen lamps.

FIG. 9 is a plan view of an arrangement of the plurality of halogen lamps HL. The 40 halogen lamps HL are arranged in two tiers, or, upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are parallel with each other along a main surface of the semiconductor wafer W held by the holder 7 (i.e., in a horizontal direction). Thus, a plane defined by the arrangement of the halogen lamps HL in each of the upper and lower tiers is also a horizontal plane.

As shown in FIG. 9, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W in which a temperature drop tends to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a trace amount of halogen element (e.g., iodine or bromine) into an inert gas such as nitrogen or argon is sealed in the glass tube. The introduction of the halogen element allows the temperature of the filament to be set at a high temperature while restricting a break in the filament. Thus, the halogen lamps HL have the properties of having a longer life than typical incandescent lamps and being capable of continuously emitting intense light. Thus, the halogen lamps HL are continuously lighting lamps that emit light continuously for at least one second or more. In addition, the halogen lamps HL, which are rod-shaped lamps, have a longer life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4, under the halogen lamps HL arranged in two tiers (FIG. 3). The reflector 43 reflects the light emitted from the halogen lamps HL toward the heat treatment space 65.

The controller 3 controls the aforementioned various operating mechanisms provided in the heat treatment apparatus 100. The controller 3 is similar in hardware configuration to a typical computer. Specifically, the controller 3 includes a CPU which is a circuit for performing various computation processes, a ROM or read-only memory for storing a basic program, a RAM or readable/writable memory for storing various pieces of information, and a magnetic disk for storing control software, data, and the like. The CPU of the controller 3 executes a predetermined processing program, whereby the processes in the heat treatment apparatus 100 proceed. The controller 3 controls the valve 84, the valve 89, the flow regulating valve 90, the flow regulating valve 196, the exhaust pump 191, and the three exhaust valves 192, 193, and 194 to adjust the pressure in the heat treatment space 65 of the treatment chamber 6, a gas supply flow rate to the treatment chamber 6, and an exhaust flow rate from the treatment chamber 6.

The heat treatment part 160 further includes, in addition to the aforementioned components, various cooling structures to prevent an excessive temperature rise in the halogen heating part 4, the flash heating part 5, and the treatment chamber 6 because of the heat energy generated from the halogen lamps HL and the flash lamps FL during the heat treatment of the semiconductor wafer W. For example, a water cooling tube (not shown) is provided in the walls of the treatment chamber 6. The halogen heating part 4 and the flash heating part 5 have an air cooling structure for forming a gas flow therein to exhaust heat. Air is supplied to a gap between the upper chamber window 63 and the lamp light irradiation window 53 to cool the flash heating part 5 and the upper chamber window 63.

A procedure for treatment of the semiconductor wafer W in the heat treatment apparatus 100 according to the present invention will now be described. A semiconductor wafer W to be treated herein is a semiconductor substrate including a high dielectric constant film formed thereover as a gate insulating film. The heat treatment apparatus 100 irradiates the semiconductor wafer W with the flash of light to perform post deposition annealing (PDA) on the semiconductor wafer W, thereby eliminating defects in the high dielectric constant film.

FIG. 11 is a view of a stack structure in which the high dielectric constant film is deposited over the semiconductor wafer W. A silicon oxide film ($SiO_2$) 102 is formed on a base material 105 of silicon of the semiconductor wafer W. The silicon oxide film 102 is a layer required as an interfacial film between the base material 105 of silicon and a high dielectric constant film 103. The thickness of the silicon oxide film 102 is extremely small and is, for example, approximately 1 nm. Various known methods such as a thermal oxidation method may be employed as a technique for forming the silicon oxide film 102.

The high dielectric constant film 103 is formed on the silicon oxide film 102 as a gate insulating film. The material for the high dielectric constant film 103 may be a high dielectric constant material such as $HfO_2$, $ZrO_2$, $Al_2O_3$, or $La_2O_3$ (in the present preferred embodiment, $HfO_2$). The high dielectric constant film 103 is formed by, for example, depositing such a high dielectric constant material on the silicon oxide film 102 by atomic layer deposition (ALD), for example. Although the high dielectric constant film 103 deposited on the silicon oxide film 102 has a thickness of several nanometers, the equivalent oxide thickness (EOT) of the high dielectric constant film 103 is approximately 1 nm. The technique of forming the high dielectric constant film 103 is not limited to the ALD, and for example, known techniques such as metal organic chemical vapor deposition (MOCVD) may be employed. If any technique is employed, many defects such as point defects are present in the high dielectric constant film 103 that has not undergone a specific process after deposition. In the structure of FIG. 11, side walls 104 of SiN are formed at both sides of the high dielectric constant film 103, which are formed before the formation of the high dielectric constant film 103 in, for example, the gate-last process. After the heat treatment by the heat treatment apparatus 100, titanium (Ti) or titanium nitride (TiN) is deposited as a metal gate on the high dielectric constant film 103.

The heat treatment apparatus 100 performs a heat treatment on the semiconductor wafer W including the high dielectric constant film 103 formed over the base material 105 with the silicon oxide film 102 between the base material 105 and the high dielectric constant film 103, as shown in FIG. 11. The procedure of the operation in the heat treatment apparatus 100 will be described below. The procedure of the operation in the heat treatment apparatus 100 proceeds as the controller 3 controls the respective operating mechanisms of the heat treatment apparatus 100.

FIG. 12 is a view illustrating a transport order of the semiconductor wafer W. In the heat treatment apparatus 100 of the present preferred embodiment, two types of transport paths are set. The two types of transport paths are different in which cool chamber is used, the first cool chamber 131 or the second cool chamber 141, and they are the same in the remaining pass chambers.

Firstly, the carrier C which houses the plurality of semiconductor wafers W on which the high dielectric constant film 103 is formed is disposed on the load port 110 of the indexer 101. Then, the delivery robot 120 takes out one semiconductor wafer W at a time from the carrier C and carries it into the alignment chamber 231 of the alignment part 230. The alignment part 230 rotates the semiconductor wafer W around the center of the semiconductor wafer W in a horizontal plane in the vertical direction and optically detects the notch, for example, to adjust the direction of the semiconductor wafer W in the alignment chamber 231.

Next, in the first transport path (an upper tier in FIG. 12), the delivery robot 120 takes the semiconductor wafer W whose direction is adjusted out from the alignment chamber 231 and carries the semiconductor wafer W into the first cool chamber 131 of the cooling part 130. Upon completion of carrying the semiconductor wafer W into the first cool chamber 131, the gate valve 181 closes a boundary between the first cool chamber 131 and the indexer 101. A boundary between the first cool chamber 131 and the transport chamber 170 is also closed by the gate valve 183. The first cool chamber 131 thereby has an enclosed space therein.

The first cool chamber 131, which originally cools the semiconductor wafer W, serve as the path for transporting the semiconductor wafer W from the delivery robot 120 to the transport robot 150 in a forward path of carrying the semiconductor wafer W into the treatment chamber 6 of the heat treatment part 160. However, since a large amount of atmospheric air is mixed into the first cool chamber 131 at the time of carrying the semiconductor wafer W into the first cool chamber 131, if the gate valve 183 is opened in such a state, an increase in oxygen concentration may occur in the transport chamber 170 and further in the treatment chamber 6.

Accordingly, the nitrogen gas is supplied from the nitrogen supply part 135 to the first cool chamber 131 before opening the gate valve 183 to replace the atmosphere in the first cool chamber 131 with the nitrogen atmosphere. When the nitrogen gas is continuously supplied from the nitrogen supply part 135 to the first cool chamber 131, the excess air is exhausted from the first cool chamber, whereby a nitrogen purge of gradually replacing the atmosphere in the first cool chamber 131 with the nitrogen atmosphere proceeds. Accordingly, an oxygen concentration in the atmosphere in the first cool chamber 131 also gradually decreases. The oxygen concentration in the atmosphere in the first cool chamber 131 decreases as the time for nitrogen purge gets longer.

After the nitrogen purge for the predetermined time is finished, the gate valve 183 opens the boundary between the first cool chamber 131 and the transport chamber 170, and the transport robot 150 carries the semiconductor wafer W out of the first cool chamber 131. The transport chamber 170 is constantly and continuously supplied with the nitrogen gas, thereby having the nitrogen atmosphere therein. The transport robot 150 which has taken out the semiconductor wafer W pivots to face the heat treatment part 160. After the semiconductor wafer W is carried out of the first cool chamber 131, the gate valve 183 closes the boundary between the first cool chamber 131 and the transport chamber 170.

Subsequently, the gate valve 185 opens a boundary between the treatment chamber 6 and the transport chamber 170, and the transport robot 150 carries the semiconductor wafer W into the treatment chamber 6. At this time, when there is a preceding semiconductor wafer W after being heat-treated in the treatment chamber 6, the semiconductor wafer W after being heat-treated is taken out by one of the transport hands 151a and 151b and then the untreated semiconductor wafer W is carried into the treatment chamber 6 by the other one of the transport hands 151a and 151b to replace the semiconductor wafer. After the semiconductor wafer W is carried into the treatment chamber 6, the gate valve 185 closes the boundary between the treatment chamber 6 and the transport chamber 170.

In the meanwhile, in the second transport path (a lower tier in FIG. 12), the delivery robot 120 carries the semiconductor wafer W which has been taken out from the alignment chamber 231 into the second cool chamber 141 of the cooling part 140. The cooling part 130 and the cooling part 140 have the same function, and a nitrogen purge is performed in the second cool chamber 141 in a manner similar to the nitrogen purge performed in the first cool chamber 131. That is to say, upon completion of carrying the semiconductor wafer W into the second cool chamber 141, the gate valve 182 closes a boundary between the second cool chamber 141 and the indexer 101. A boundary between the second cool chamber 141 and the transport chamber 170 is closed by the gate valve 184. The second cool chamber 141 thereby has an enclosed space therein.

In the aforementioned state, the nitrogen gas is supplied from the nitrogen supply part 145 to the second cool chamber 141 before opening the gate valve 184 to perform the nitrogen purge for replacing the atmosphere in the second cool chamber 141 with the nitrogen atmosphere. In accordance with the nitrogen purge, the oxygen concentration in the atmosphere in the second cool chamber 141 also gradually decreases, and the oxygen concentration in the atmosphere in the second cool chamber 141 also decreases as the time for nitrogen purge gets longer.

After the nitrogen purge for the predetermined time is finished, the gate valve 184 opens the boundary between the second cool chamber 141 and the transport chamber 170, and the transport robot 150 carries the semiconductor wafer W out of the second cool chamber 141. The transport robot 150 which has taken out the semiconductor wafer W pivots to face the heat treatment part 160. After the semiconductor wafer W is carried out of the second cool chamber 141, the gate valve 184 closes the boundary between the second cool chamber 141 and the transport chamber 170. Subsequently, the gate valve 185 opens the boundary between the treatment chamber 6 and the transport chamber 170, and the transport robot 150 carries the semiconductor wafer W into the treatment chamber 6. After the semiconductor wafer W is carried into the treatment chamber 6, the gate valve 185 closes the boundary between the treatment chamber 6 and the transport chamber 170.

As described above, there is no difference in the process between the first transport path and the second transport path, and there is only the difference which chamber is used, the first cool chamber 131 or the second cool chamber 141. In other words, the first cool chamber 131 and the second cool chamber 141 are parallel treatment parts, and the heat treatment apparatus 100 includes the two transport paths for performing the same treatment.

It is optional which of the first transport path and the second transport path is used for transporting the semiconductor wafer W to be treated. For example, the plurality of semiconductor wafers W constituting a lot may be transported through the first transport path and the second transport path alternately. That is to say, in the plurality of semiconductor wafers W constituting the lot, odd-numbered wafers may be transported through the first transport path, and even-numbered wafers may be transported through the second transport path.

The semiconductor wafer W which has been carried into the treatment chamber 6 of the heat treatment part 160 is preheated by the halogen lamps HL, and subsequently, the flash heating treatment is performed on the semiconductor wafer W by the flash irradiation from the flash lamp FL. The heat treatment of the semiconductor wafer W in the heat treatment part 160 is described in more detail hereinafter.

After the completion of flash heating treatment, the gate valve 185 opens, and then the transport robot 150 carries the semiconductor wafer W after the flash heating treatment from the treatment chamber 6. The transport robot 150, which has faced the treatment chamber 6 and taken out the semiconductor wafer W transported in the first transport path, pivots to face the first cool chamber 131 of the cooling part 130. The gate valve 185 closes the boundary between the treatment chamber 6 and the transport chamber 170, and the gate valve 183 opens the boundary between the first cool chamber 131 and the transport chamber 170. Subsequently, the transport robot 150 carries the semiconductor wafer W immediate after the flash heating into the first cool chamber 131. Upon completion of carrying the semiconductor wafer W after flash heating into the first cool chamber 131, the gate valve 183 closes the boundary between the first cool chamber 131 and the transfer chamber 170. In the first cool chamber 131, the cooling treatment is performed on the semiconductor wafer W after the flash heating treatment. Since the whole semiconductor wafer W has the relatively high temperature at the time of being carried out of the treatment chamber 6 of the heat treatment part 160, the semiconductor wafer W is cooled to around the room temperature in the first cool chamber 131. After an elapse of a predetermined cooling treatment time, the gate valve 181 opens the boundary between the first cool chamber 131 and the indexer 101, and the delivery robot 120 carries the semiconductor wafer W after being cooled out of the first cool chamber 131 to return it to the carrier C.

In the meanwhile, the transport robot 150, which has faced the treatment chamber 6 and taken out the semiconductor wafer W transported in the second transport path, pivots to face the second cool chamber 141 of the cooling part 140. The gate valve 185 closes the boundary between the treatment chamber 6 and the transport chamber 170, and the gate valve 184 opens the boundary between the second cool chamber 141 and the transport chamber 170. Subsequently, the transport robot 150 carries the semiconductor wafer W immediate after the flash heating into the second cool chamber 141. Upon completion of carrying the semiconductor wafer W after the flash heating into the second cool chamber 141, the gate valve 184 closes the boundary between the second cool chamber 141 and the transfer chamber 170. In the second cool chamber 141, the cooling treatment is performed on the semiconductor wafer W after the flash heating treatment. After an elapse of a predetermined cooling treatment time, the gate valve 182 opens the boundary between the second cool chamber 141 and the indexer 101, and the delivery robot 120 carries the semiconductor wafer W after being cooled out of the second cool chamber 141 to return it to the carrier C.

As described above, also in the backward path from the treatment chamber 6, there is no difference in the process between the first transport path and the second transport path, and there is only the difference which chamber, the first cool chamber 131 or the second cool chamber 141, is used to cool the semiconductor wafer W. When the predetermined number of semiconductor wafers W after being treated are housed in the carrier C, the carrier C is carried out of the load port 110 of the indexer 101.

Herein, a process of specifically transporting 25 semiconductor wafers W constituting one lot to each chamber in sequence is described based on FIG. 13. FIG. 13 illustrates a movement of each semiconductor wafer W1 to W25 of 25 wafers constituting one lot in each transport cycle, and illustrates an example of transporting odd-numbered wafers in the first transport path and transporting even-numbered wafers in the second transport path. The transport cycle herein indicates one cyclic transport operation performed by a transport operation of the delivery robot 120 or a transport operation by a cooperation between the delivery robot 120 and transport robot 150.

In FIG. 13, firstly in a transport cycle 1, the delivery robot 120 takes the semiconductor wafer W1 which is the odd-numbered wafer out from the carrier C and carries it into the alignment chamber 231.

In a transport cycle 2, the delivery robot 120 takes the semiconductor wafer W1 whose direction is adjusted out from the alignment chamber 231 and carries it into the first cool chamber 131, and also takes the semiconductor wafer W2 which is the even-numbered wafer out from the carrier C and carries it into the alignment chamber 231.

In a transport cycle 3, the transport robot 150 takes the semiconductor wafer W1 out from the first cool chamber 131 and holds the semiconductor wafer W1 in the transport chamber 170. In the meanwhile, the delivery robot 120 takes the semiconductor wafer W2 whose direction is adjusted out from the alignment chamber 231 and carries it into the second cool chamber 141, and also takes the semiconductor wafer W3 which is the odd-numbered wafer out from the carrier C and carries it into the alignment chamber 231.

In a transport cycle 4, the transport robot 150 carries the semiconductor wafer W1 held in the transport chamber 170 into the treatment chamber 6, and also takes the semiconductor wafer W2 from the second cool chamber 141 using one of the transport hands 151a and 151b (herein, the transport hand 151a) and holds the semiconductor wafer W2 in the transport chamber 170. In the meanwhile, in the transport cycle 4, the delivery robot 120 takes the semiconductor wafer W3 whose direction is adjusted out from the alignment chamber 231 and carries it into the first cool chamber 131, and also takes the semiconductor wafer W4 which is the even-numbered wafer out from the carrier C and carries it into the alignment chamber 231.

In a transport cycle 5, the transport robot 150 takes the semiconductor wafer W1 after being heat-treated out from the treatment chamber 6 using the empty transport hand 151b which does not hold the semiconductor wafer W, and carries the semiconductor wafer W2 held by the transport hand 151a into the treatment chamber 6 to replace the wafer. Furthermore, the transport robot 150 turns to the first cool chamber 131 and takes the semiconductor wafer W3 out from the first cool chamber 131 using the empty transport hand 151a which does not hold the semiconductor wafer, and also carries the semiconductor wafer W1 after being heat-treated, held by the transport hand 151b, into the first cool chamber 131 to replace the wafer. In the meanwhile, in the transport cycle 5, the delivery robot 120 takes the semiconductor wafer W4 whose direction is adjusted out from the alignment chamber 231 and carries it into the second cool chamber 141, and also takes the semiconductor wafer W5 which is the odd-numbered wafer out from the carrier C and carries it into the alignment chamber 231.

Next, in a transport cycle 6, the transport robot 150 takes the semiconductor wafer W2 after being heat-treated out from the treatment chamber 6 using the empty transport hand 151b, and carries the semiconductor wafer W3 held by the transport hand 151a into the treatment chamber 6 to replace the wafer. Furthermore, the transport robot 150 turns to the second cool chamber 141 and takes the semiconductor wafer W4 out from the second cool chamber 141 using the empty transport hand 151a, and also carries the semiconductor wafer W2 after being heat-treated, held by the transport hand 151b, into the second cool chamber 141 to replace the wafer. In the meanwhile, in the transport cycle 6, the delivery robot 120 takes the semiconductor wafer W1 after the cooling treatment out from the first cool chamber 131 and houses the semiconductor wafer W1 in an original position in the carrier C. The delivery robot 120 takes the semiconductor wafer W5 whose direction is adjusted out from the alignment chamber 231 and carries it into the first cool chamber 131, and also takes the semiconductor wafer W6 which is the even-numbered wafer out from the carrier C and carries it into the alignment chamber 231.

Next, in a transport cycle 7, the transport robot 150 takes the semiconductor wafer W3 after being heat-treated out from the treatment chamber 6 using the empty transport hand 151b, and carries the semiconductor wafer W4 held by the transport hand 151a into the treatment chamber 6 to replace the wafer. Furthermore, the transport robot 150 turns to the first cool chamber 131 and takes the semiconductor wafer W5 out from the first cool chamber 131 using the empty transport hand 151a, and also carries the semiconductor wafer W3 after being heat-treated, held by the transport hand 151b, into the first cool chamber 131 to replace the wafer. In the meanwhile, in the transport cycle 7, the delivery robot 120 takes the semiconductor wafer W2 after the cooling treatment out from the second cool chamber 141 and houses the semiconductor wafer W2 in an original position in the carrier C. The delivery robot 120 takes the semiconductor wafer W6 whose direction is adjusted out from the alignment chamber 231 and carries it into the second cool chamber 141, and also takes the semiconductor wafer W7 which is the odd-numbered wafer out from the carrier C and carries it into the alignment chamber 231.

Such transport cycles are repeated up to the semiconductor wafer W25, which is a last wafer in the lot, as shown in FIG. 13 (repeated to the transport cycle 30), whereby the first cool chamber 131 and the second cool chamber 141 are fully used without loss, and the treatment and transport of the semiconductor wafer W can be efficiently performed.

Next, the flash heating treatment in the heat treatment part 160 is described. The transport robot 150 carries the semiconductor wafer W into the treatment chamber 6 of the heat treatment part 160 in a state where the gate valve 185 is opened and the transport opening 66 is opened. At this time, it is also applicable that the valve 84 is opened and the nitrogen gas is thereby continuously supplied from the gas supply source 85 to the treatment chamber 6 so as to flow the nitrogen gas out from the transport opening 66. This allows a maximum suppression of the atmosphere in the transport chamber 170 flowing in the treatment chamber 6.

The semiconductor wafer W carried by the transport robot 150 is moved forward to a position directly above the holder 7 and is stopped thereat. Subsequently, the pair of transfer arms 11 of the transfer mechanism 10 are moved horizontally from the retracted position to the transfer operation position and are moved upwardly, so that the lift pins 12 pass through the through holes 79 and protrude from the upper surface of the susceptor 74 to receive the semiconductor wafer W.

After the semiconductor wafer W is disposed on the lift pins 12, the transport robot 150 moves out of the heat treatment space 65, and the gate valve 185 closes the transport opening 66. Subsequently, the pair of transfer arms 11 move downwardly to transport the semiconductor wafer W from the transfer mechanism 10 to the susceptor 74 of the holder 7, so that the semiconductor wafer W is held in a horizontal position. The semiconductor wafer W is held on the susceptor 74 in such a position that a front surface thereof over which the high dielectric constant film 103 is deposited is the upper surface. The semiconductor wafer W is held inside the five guide pins 76 on the upper surface of the susceptor 74. The pair of transfer arms 11 moved downwardly below the susceptor 74 are moved back to the retracted position, that is to say, to the inside of the recessed portion 62, by the horizontal movement mechanism 13.

After the semiconductor wafer W is housed in the treatment chamber 6 and the transport opening 66 is closed by the gate valve 185, the pressure in the treatment chamber 6 is reduced to a pressure which is lower than the atmospheric pressure. Specifically, the transport opening 66 is closed, so that the heat treatment space 65 in the treatment chamber 6 becomes an enclosed space. In the above state, the valve 89 for exhausting the gas is opened while the valve 84 for supplying the gas is closed. The controller 3 opens the exhaust valve 192 provided in the bypass line 197 having the smallest pipe diameter among the three bypass lines 197, 198, and 199 while operating the exhaust pump 191. The other exhaust valves 193 and 194 are closed. Accordingly, the gas is exhausted from the treatment chamber 6 while not gas is supplied into the treatment chamber 6, so that the pressure in the heat treatment space 65 in the treatment chamber 6 is reduced.

Figure 14:
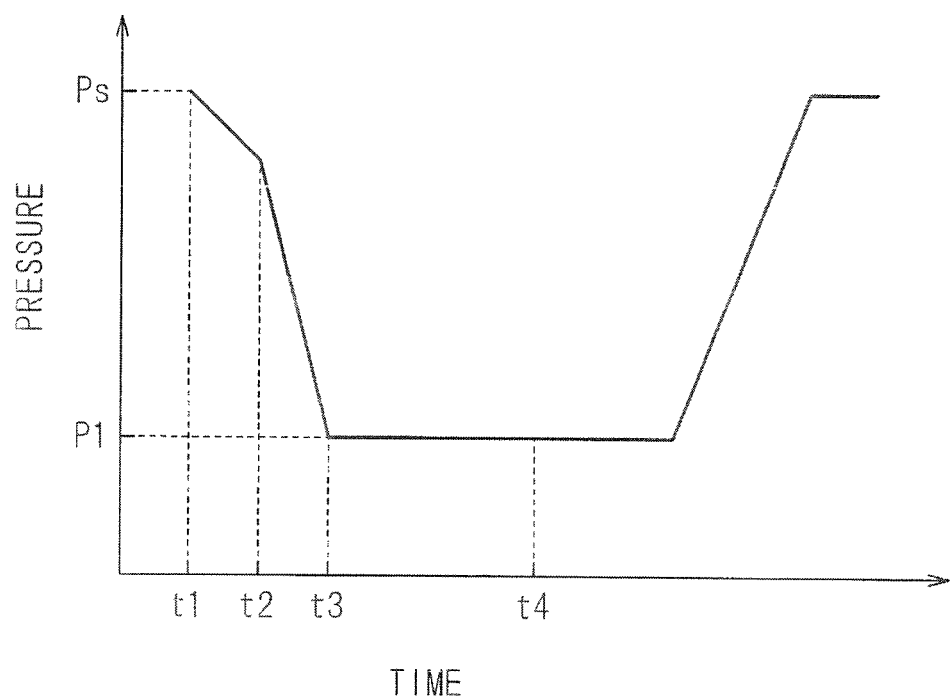
FIG. 14 is a graph showing changes in pressure in a treatment chamber.

FIG. 14 is a graph showing changes in pressure in the treatment chamber 6. In FIG. 14, the horizontal axis represents time, and the vertical axis represents pressure in the treatment chamber 6. At the time when the semiconductor wafer W is housed in the treatment chamber 6 and the transport opening 66 is closed, the pressure in the treatment chamber 6 is equal to ordinary pressure Ps (=atmospheric pressure=approximately 101325 Pa). Then, at a time t1, a reduction in pressure in the treatment chamber 6 starts. In an early stage of the pressure reduction, only the bypass line 197 having the smallest pipe diameter among the three bypass lines 197, 198, and 199 is used, so that an exhaust flow rate is low and an exhaust speed is relatively low.

Then, at a time t2, the controller 3 opens all the three exhaust valves 192, 193, and 194. As a result, the exhaust flow rate from the treatment chamber 6 increases, and the exhaust speed becomes faster. Then, at a time t3, the pressure (degree of vacuum) in the treatment chamber 6 becomes equal to a pressure P1. The pressure P1 is, for example, approximately 100 Pa. That is to say, after the gas is exhausted at a low exhaust flow rate in the early stage of the pressure reduction, the exhaust flow rate is changed to a higher exhaust flow rate, and the gas is exhausted at the higher exhaust flow rate.

If the gas is exhaust rapidly at a high exhaust flow rate from the start of the pressure reduction, there is a danger that a large gas flow change may occur in the treatment chamber 6 to cause particles deposited on structures (e.g. the lower chamber window 64) of the treatment chamber 6 to swirl up and be deposited again on the semiconductor wafer W, resulting in contamination of the semiconductor wafer W. When the exhaust flow rate is changed to a higher exhaust flow rate and the gas is exhausted at the higher exhausted flow rate after the gas is exhausted gently at a low exhaust flow rate in the early stage of the pressure reduction, the swirling-up of particles in the treatment chamber 6 can be prevented.

At the time t3 when the pressure in the chamber 6 becomes equal to the pressure P1, the valve 89 for exhausting the gas is closed. Then, the pressure in the treatment chamber 6 is maintained at the pressure P1 without introducing the treatment gas in the treatment chamber 6. The valve 89 may be opened to continuously exhausting the gas so that the pressure in the treatment chamber 6 is maintained at the pressure P1.

Subsequently, the 40 halogen lamps HL of the halogen heating part 4 turn on simultaneously to start preheating (or assist-heating) the semiconductor wafer W while maintaining the pressure in the treatment chamber 6 at the pressure P1. The halogen light emitted from the halogen lamps HL is transmitted through the lower chamber window 64 and the susceptor 74 that are made of quartz, and impinges upon the back surface of the semiconductor wafer W. The back surface of the semiconductor wafer W refers to a main surface thereof opposite to the front surface with the high dielectric constant film 103 deposited thereover. The semiconductor wafer W is irradiated with the halogen light from the halogen lamps HL, so that the temperature of the semiconductor wafer W increases. It should be noted that the transfer arms 11 of the transfer mechanism 10, which have been retracted to the inside of the recessed portion 62, do not block the heating using the halogen lamps HL.

The temperature of the semiconductor wafer W is measured with the contact-type thermometer 330 when the halogen lamps HL perform the preheating. That is to say, the contact-type thermometer 330 including a built-in thermocouple comes through the cut-out portion 77 into contact with the lower surface of the semiconductor wafer W held by the susceptor 74 to measure the temperature of the semiconductor wafer W that is during a temperature rise. The measured temperature of the semiconductor wafer W is transmitted to the controller 3. The controller 3 controls the output from the halogen lamps HL while monitoring whether the temperature of the semiconductor wafer W, which is during a temperature rise by the irradiation with light of the halogen lamps HL, reaches a predetermined preheating temperature Ti. In other words, the controller 3 performs feedback control on the output of the halogen lamps HL, based on the value measured with the contact-type thermometer 330, so that the temperature of the semiconductor wafer W is equal to the preheating temperature T1. The preheating temperature T1 is in the range of 300° C. to 600° C., and is 450° C. in the present preferred embodiment. It should be noted that, when the temperature of the semiconductor wafer W is increased by the irradiation with light from the halogen lamps HL, the temperature is not measured with the radiation thermometer 320. This is because the halogen light emitted from the halogen lamps HL enters the radiation thermometer 320 in the form of disturbance light to obstruct the accurate measurement of the temperature.

After the temperature of the semiconductor wafer W reaches the preheating temperature T1, the controller 3 maintains the temperature of the semiconductor wafer W at the preheating temperature T1 for a short time. Specifically, at the time when the temperature of the semiconductor wafer W measured with the contact-type thermometer 330 reaches the preheating temperature T1, the controller 3 adjusts the output of the halogen lamps HL to maintain the temperature of the semiconductor wafer W at approximately the preheating temperature T1.

Such preheating using the halogen lamps HL uniformly increases the temperature of the entire semiconductor wafer W including the high dielectric constant film 103 to the preheating temperature T1. In the preheating stage using the halogen lamps HL, the semiconductor wafer W shows a tendency to be lower in temperature in a peripheral portion thereof where heat dissipation tends to occur than in a central portion thereof. However, the halogen lamps HL in the halogen heating part 4 are disposed at a higher density in the region opposed to the peripheral portion of the semiconductor wafer W than in a region opposed to the central portion thereof. This causes a greater amount of light to impinge upon the peripheral portion of the semiconductor wafer W where heat dissipation tends to occur, thereby providing a uniform in-plane temperature distribution of the semiconductor wafer W in the preheating stage. Further, the inner peripheral surface of the reflection ring 69 mounted to the chamber side portion 61 is provided as a mirror surface. Thus, a greater amount of light is reflected from the inner peripheral surface of the reflection ring 69 toward the peripheral portion of the semiconductor wafer W. This leads to a more uniform in-plane temperature distribution of the semiconductor wafer W in the preheating stage. It should be noted that the pressure in the treatment chamber 6 during the preheating is maintained at the pressure P1.

Then, the flash lamps FL emit a flash of light to perform a flash heating treatment at a time t4 when a predetermined time period has elapsed since the temperature of the semiconductor wafer W reached the preheating temperature T1. At this time, part of the flash of light emitted from the flash lamps FL travels directly toward the interior of the treatment chamber 6. The remainder of the flash of light is reflected once from the reflector 52, and then travels toward the interior of the treatment chamber 6. The irradiation of the semiconductor wafer W with such flashes of light achieves the flash heating treatment of the semiconductor wafer W.

The flash heating treatment, which is achieved by the emission of a flash of light from the flash lamps FL, can increase the temperature of the front surface of the semiconductor wafer W in a short time. Specifically, the flash of light emitted from the flash lamps FL is an intense flash of light emitted for an extremely short period of time ranging from about 0.1 to 100 milliseconds as a result of the conversion of the electrostatic energy previously stored in the capacitor into such an ultrashort light pulse. By irradiating the front surface of the semiconductor wafer W, which includes the high dielectric constant film 103 deposited over the base material 105 with the silicon oxide film 102 between the base material 105 and the high dielectric constant film 103, with a flash of light from the flash lamps FL, the temperature of the front surface of the semiconductor wafer W including the high dielectric constant film 103 is momentarily increased to a treatment temperature T2, so that the post deposition annealing is performed. The treatment temperature T2 that is a maximum temperature (peak temperature) reached by the temperature of the front surface of the semiconductor wafer W subjected to irradiation with a flash of light is in the range of 600° C. to 1200° C., and is 1000° C. in the present preferred embodiment.

When the temperature of the front surface of the semiconductor wafer W rises to the treatment temperature T2 and the post deposition annealing is performed, defects such as point defects present in the high dielectric constant film 103 disappear. The light emission time of the flash lamps FL is a short time period ranging from approximately 0.1 to 100 milliseconds. The time required for the temperature of the front surface of the semiconductor wafer W to increase from the preheating temperature T1 to the treatment temperature T2 is also accordingly an extremely short time period of less than one second. After the flash irradiation, the temperature of the front surface of the semiconductor wafer W rapidly decreases from the treatment temperature T2.

After the flash heating treatment, the valve 84 for supplying the gas is opened after predetermined time period has elapsed to supply a nitrogen gas from the gas supply source 85 to the treatment chamber 6, thereby returning the pressure in the treatment chamber 6 to the ordinary pressure Ps. The halogen lamps HL also turn off, so that the temperature of the semiconductor wafer W also decreases from the preheating temperature T1. The contact-type thermometer 330 or the radiation thermometer 320 measures the temperature of the semiconductor waver W which is on the decrease. The result of the measurement is transmitted to the controller 3. The controller 3 monitors whether the temperature of the semiconductor wafer W has decreased to a predetermined temperature, based on the result of the measurement. After the temperature of the semiconductor wafer W decreases to the predetermined temperature or below, the pair of transfer arms 11 of the transfer mechanism 10 are moved horizontally again from the retracted position to the transfer operation position and are then moved upwardly, so that the lift pins 12 protrude from the upper surface of the susceptor 74 to receive the semiconductor wafer W after heat treatment from the susceptor 74. Subsequently, the transport opening 66 which has been closed by the gate valve 185 is opened, and the transport robot 150 carries the semiconductor wafer W disposed on the lift pins 12 to the outside. Thus, the heat treatment part 160 completes the heating treatment of the semiconductor wafer W.

In the present preferred embodiment, the two cool chambers, that is, the first cool chamber 131 and the second cool chamber 141 are provided in the heat treatment apparatus 100, and the semiconductor wafer W after being heat-treated in the heat treatment part 160 is alternately transported to the first cool chamber 131 or the second cool chamber 141 to be cooled. As described above, although the flash heating treatment itself using the flash lamps FL is performed for the extremely short time less than one second, it takes considerable time (approximately several tens of seconds) to cool the semiconductor wafer W after being heat-treated to the temperature at which the semiconductor wafer W can be carried to the outside. Since the semiconductor wafer W after being heat-treated is alternately transported to the first cool chamber 131 or the second cool chamber 141 to be cooled in the present preferred embodiment, the sufficient cooling time is secured for the independent semiconductor wafer W, and the reduction in throughput as the whole heat treatment apparatus 100 can be suppressed.

The untreated semiconductor wafer W is alternately transported to the first cool chamber 131 or the second cool chamber 141 also before being heat-treated to perform the nitrogen purge. Thus, similar to the cooling time, the sufficient time for nitrogen purge can be also secured in each of the first cool chamber 131 and the second cool chamber 141. When the time for nitrogen purge in the first cool chamber 131 and the second cool chamber 141 is sufficiently long, the oxygen concentration in the atmosphere therein can also be sufficiently reduced. As a result, the increase in oxygen concentration in the transport chamber 170 at the time of opening the gate valves 183 and 184 can be suppressed to approximately 50 ppm at a maximum. It is also possible to suppress the increase in oxygen concentration in the treatment chamber 6 caused by the gas incorporation, at the time of opening the gate valve 185 and carrying the semiconductor wafer W from the transport chamber 170 to the treatment chamber 6, to approximately 10 ppm at a maximum.

Furthermore, in the present preferred embodiment, the pressure in the treatment chamber 6 is reduced to the pressure P1, which is lower than the atmospheric pressure, at the time of heat treatment and is then maintained at the pressure P1, so that the oxygen concentration in the heat treatment space 65 in the treatment chamber 6 at the time of performing the post deposition annealing on the high dielectric constant film 103 can be further reduced to approximately 100 ppb or less. When the pressure is reduced from approximately 100 kPa to the pressure P1=100 Pa as the present preferred embodiment, the oxygen concentration in the treatment chamber 6 at the time of performing the heat treatment can be reduced to 10 ppb.

As described above, since many defects such as point defects are present in the high dielectric constant film 103 that has not undergone a specific process after deposition, such defects need to be eliminated by the post deposition annealing. When there is oxygen at the time of performing the post deposition annealing, the silicon oxide film 102, which is a base of the high dielectric constant film 103, takes in the oxygen and grows up. This leads to an increase in a thickness of the silicon oxide film 102, so that the high dielectric constant cannot be obtained. Oxygen remaining in the treatment chamber 6 becomes a particular problem as a cause of the increase in the film thickness. Accordingly, the oxygen concentration in the atmosphere at the time of performing the post deposition annealing on the high dielectric constant film 103 is preferably reduced as much as possible.

In the present preferred embodiment, the two cool chambers 131 and 141 are provided to sufficiently secure the time for nitrogen purge at the time of carrying in the semiconductor wafer W. Moreover, the pressure in the treatment chamber 6 is reduced to the pressure P1, which is lower than the atmospheric pressure, and is then maintained at the pressure P1, to reduce the oxygen concentration in the heat treatment space 65 in the treatment chamber 6 at the time of performing the post deposition annealing on the high dielectric constant film 103 to approximately 100 ppb or less. Accordingly, it is possible to suppress the increase in the thickness of the silicon oxide film 102, which is the base of the high dielectric constant film 103, caused by taking in the oxygen from the heat treatment space 65 during the post deposition annealing.

Rather, when the post deposition annealing is performed on the high dielectric constant film 103 by the flash irradiation, observed is a tendency that defects are eliminated by baking the high dielectric constant film 103 and the thickness of the high dielectric constant film 103 slightly decreases. A degree of decrease in thickness of the high dielectric constant film 103 also increases with the decrease in oxygen concentration as the present preferred embodiment. As one example, when the atmosphere in the treatment chamber 6 is simply replaced with the nitrogen atmosphere while maintaining the pressure in the treatment chamber 6 at the ordinary pressure without using the technique as the present preferred embodiment, the thickness of the high dielectric constant film 103 decreases by 0.131 nm. In contrast, when the pressure in the treatment chamber 6 is reduced to the pressure P1 which is lower than the atmospheric pressure, the thickness of the high dielectric constant film 103 decreases by 0.135 nm.

Moreover, since the first cool chamber 131 and the second cool chamber 141 are provided to set the two transport paths equivalent to each other, even when a maintenance operation of one of the transport paths is necessary, the treatment of the semiconductor wafer W can be continued using the other transport path.

While the preferred embodiments of the present invention have been described above, various modifications to the present invention in addition to those described above may be made without departing from the scope and spirit of the invention. For example, in the above preferred embodiment, the pressure in the treatment chamber 6 is reduced to the pressure P1, which is lower than the atmospheric pressure, and is then maintained at the pressure P1, however, it is also applicable that the pressure in the treatment chamber 6 is once reduced to the pressure P1, which is lower than the atmospheric pressure, and subsequently, the nitrogen gas is supplied to the treatment chamber 6 to return the pressure in the treatment chamber 6 to the pressure higher than the pressure P1. The pressure after the pressure return may be the atmospheric pressure. Regardless of whether or not the pressure return is performed, when the pressure in the treatment chamber 6 is once reduced to the pressure P1, the oxygen concentration in the heat treatment space 65 in the treatment chamber 6 at the time of flash heating can be reduced to the same degree as the above preferred embodiment.

When the pressure in the treatment chamber 6 is once reduced to the pressure P1 and subsequently, the nitrogen gas is supplied to return the pressure in the treatment chamber 6 to the atmospheric pressure to perform the flash heating treatment on the semiconductor wafer W, it is applicable to flow the nitrogen gas into the treatment chamber 6 at a flow rate of 100 liters per minute for two second immediate after the flash irradiation from the flash lamps FL. Thereby, particles occurring by a vibration of the semiconductor wafer W on the susceptor 74 caused by the flash irradiation are swept away, so that an attachment of the particles on the semiconductor wafer W can be prevented.

The treatment gas supplied at the time of returning the pressure in the treatment chamber 6 which has been once reduced to the pressure P1, which is lower than the atmospheric pressure, is not limited to the nitrogen gas, but may be a treatment gas including ammonia or hydrogen gas. In the above case, the flash heating treatment is performed on the semiconductor wafer W in atmosphere including ammonia or hydrogen gas, for example.

The step of reducing the pressure in the treatment chamber 6 to the pressure P1 which is lower than the atmospheric pressure is not necessarily required. The oxygen concentration in the treatment chamber 6 at the time of performing the heat treatment can be suppressed to 200 ppb or less by just alternately carrying the semiconductor wafer W into the two cool chambers 131 and 141 to sufficiently secure the time for nitrogen purge, as the above preferred embodiment. It should be noted that the nitrogen gas is constantly and continuously supplied to the transport chamber 170 and the treatment chamber 6.

Although the two cool chambers 131 and 141 are connected to the transport chamber 170 in the above preferred embodiment, the configuration is not limited thereto, but three or more cool chambers can be provided to be connected to the transport chamber 170. The three or more cools chambers are parallel treatment parts including the same function, thereby the three or more transport paths equivalent to each other are set in the heat treatment apparatus 100. It is optional which transport path is used for transporting each of the plurality of semiconductor wafers W which constitutes the lot. For example, the plurality of semiconductor wafers W may be repeatedly carried into the three or more cool chambers in sequence. When the untreated semiconductor wafer W is carried into any one of the cool chambers, the nitrogen purge is performed by continuously supplying the nitrogen gas to the cool chamber to replace the atmosphere with the nitrogen atmosphere, in a manner similar to the above preferred embodiment. After the flash heating treatment of the semiconductor wafer W is finished, the semiconductor wafer W is carried into the cool chamber to perform the cooling treatment.

According to the above configuration also, in a manner similar to the above preferred embodiment, the sufficient cooling time is secured for the independent semiconductor wafer W, and the reduction in throughput as the whole heat treatment apparatus 100 can be suppressed. The sufficient time for nitrogen purge is also secured at the time of carrying in the untreated semiconductor wafer W to suppress the increase in oxygen concentration in the treatment chamber 6. As a total number of disposed cool chambers increases, the cooling time and the time for nitrogen purge can be secured long, however, a footprint of the heat treatment apparatus 100 is increased by increasing the number of disposed chambers. Thus, it is preferable to set the number of disposed cool chambers in accordance with a balance between the required cooling time and time for nitrogen purge and the footprint. In the above preferred embodiment, the exhaust flow rate from the treatment chamber 6 is switched in two steps by the three bypass lines 197, 198, and 199, however, instead of them, the exhaust flow rate can be regulated in a continuous and stepless manner by the flow regulating valve 196.

The semiconductor wafer W to be treated in the heat treatment apparatus 100 is not limited to the semiconductor wafer W in which the high dielectric constant film 103 as the gate insulating film is formed on the silicon oxide film 102, but may be the semiconductor wafer W in which a metal gate is further deposited on the high dielectric constant film 103. The raw material for the metal gate may be, for example, titanium nitride (TiN), titanium aluminum (TiAl), or tungsten (W). Alternatively, the semiconductor wafer W to be treated may be formed by depositing a metal film and form silicide or germanide through the flash heating treatment. Furthermore, the semiconductor wafer W to be treated may activate impurities implanted in the semiconductor wafer W through the flash heating treatment.

While the invention has been shown and described in detail, the foregoing description is in all aspects illustrative and not restrictive. It is therefore understood that numerous modifications and variations can be devised without departing from the scope of the invention.

What is claimed is:

1. A heat treatment method of irradiating a substrate with a flash of light to heat said substrate, comprising steps of:
   (a) carrying a first substrate before treatment into a first cool chamber and supplying a nitrogen gas to said first cool chamber to replace an atmosphere to a nitrogen atmosphere;
   (b) taking said first substrate out from said first cool chamber and carrying said first substrate into a treatment chamber connected to a transport chamber using a transport robot which is provided in said transport chamber connected to said first cool chamber;
   (c) irradiating said first substrate in said treatment chamber with a flash of light to heat said first substrate;
   (d) carrying said first substrate after heat treatment out of said treatment chamber and delivering said first substrate to said first cool chamber using said transport robot;
   (e) cooling said first substrate in said first cool chamber and carrying said first substrate after being cooled out of said first cool chamber;
   (f) carrying a second substrate before treatment into a second cool chamber connected to said transport chamber and supplying a nitrogen gas to said second cool chamber to replace an atmosphere with a nitrogen atmosphere;

(g) taking said second substrate out from said second cool chamber and carrying said second substrate into said treatment chamber using said transport robot;

(h) irradiating said second substrate in said treatment chamber with a flash of light to heat said second substrate;

(i) carrying said second substrate after heat treatment out of said treatment chamber and delivering said second substrate to said second cool chamber using said transport robot; and (j) cooling said second substrate in said second cool chamber and carrying said second substrate after being cooled out of said second cool chamber, wherein steps from said step (a) to said step (e) and steps from said step (f) to said step (j) are alternately repeated.

2. The heat treatment method according to claim 1, further comprising steps of:

(k) before said step (a), adjusting a direction of said first substrate; and (l) before said step (f), adjusting a direction of said second substrate.

3. The heat treatment method according to claim 1, wherein said step (c) comprises steps of (c-1) reducing a pressure in said treatment chamber which houses said first substrate to a first pressure lower than an atmospheric pressure and (c-2) irradiating a surface of said first substrate with a flash of light from a flash lamp while maintaining said pressure in said treatment chamber at said first pressure, and said step (h) comprises steps of (h-1) reducing a pressure in said treatment chamber which houses said second substrate to said first pressure and (h-2) irradiating a surface of said second substrate with a flash of light from said flash lamp while maintaining said pressure in said treatment chamber at said first pressure.

4. A heat treatment apparatus for irradiating a substrate with a flash of light to heat said substrate, comprising:

a transport chamber including a transport robot;

a plurality of cool chambers connected to said transport chamber;

a treatment chamber connected to said transport chamber;

a flash lamp for irradiating a substrate housed in said treatment chamber with a flash of light to heat said substrate;

an atmosphere replacing part for supplying a nitrogen gas to each of said plurality of cool chambers to replace an atmosphere in each of said plurality of cool chambers with a nitrogen atmosphere; and a controller for controlling said transport robot and said atmosphere replacing part so that when a substrate before treatment is carried into one of said plurality of cool chambers in sequence, after a nitrogen gas is supplied to said cool chamber to replace an atmosphere in said cool chamber with a nitrogen atmosphere, said substrate is taken out from said cool chamber and carried into said treatment chamber and said substrate after heat treatment is carried out of said treatment chamber to be delivered to said cool chamber.

5. The heat treatment apparatus according to claim 4, further comprising an alignment chamber for adjusting a direction of said substrate before treatment before being carried into one of said plurality of cool chambers.

6. The heat treatment apparatus according to claim 4, further comprising an exhaust part for exhausting an atmosphere in said treatment chamber, wherein said controller is configured to control said exhaust part so that after a pressure in said treatment chamber is reduced to a first pressure lower than an atmospheric pressure, a surface of said substrate is irradiated with a flash of light from said flash lamp while maintaining said pressure at said first pressure.

* * * * *